United States Patent
Yamazaki et al.

(10) Patent No.: US 7,585,714 B2
(45) Date of Patent: Sep. 8, 2009

(54) METHOD FOR MANUFACTURING SEMICONDUCTOR DEVICE, SEMICONDUCTOR DEVICE, AND LASER IRRADIATION APPARATUS

(75) Inventors: Shunpei Yamazaki, Tokyo (JP); Osamu Nakamura, Kanagawa (JP); Hironobu Shoji, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/637,914

(22) Filed: Dec. 13, 2006

(65) Prior Publication Data
US 2007/0099440 A1 May 3, 2007

Related U.S. Application Data

(62) Division of application No. 10/701,174, filed on Nov. 5, 2003, now Pat. No. 7,160,762.

(30) Foreign Application Priority Data
Nov. 8, 2002 (JP) ............................. 2002-325340
Nov. 8, 2002 (JP) ............................. 2002-325357

(51) Int. Cl.
H01L 21/00 (2006.01)
H01L 21/336 (2006.01)
(52) U.S. Cl. ................... 438/164; 438/181; 438/308; 438/795; 257/66; 257/72; 257/E51.005; 257/E33.001
(58) Field of Classification Search .................. 438/149, 438/164, 181, 308, 795
See application file for complete search history.

(56) References Cited

U.S. PATENT DOCUMENTS

| | | | |
|---|---|---|---|
| 5,643,801 A | 7/1997 | Ishihara et al. |
| 5,897,799 A | 4/1999 | Yamazaki et al. |
| 5,900,980 A | 5/1999 | Yamazaki et al. |
| 5,923,962 A | 7/1999 | Ohtani et al. |
| 5,953,597 A | 9/1999 | Kusumoto et al. |
| 5,959,779 A | 9/1999 | Yamazaki et al. |

(Continued)

FOREIGN PATENT DOCUMENTS

JP        61-187223 A    8/1986

(Continued)

*Primary Examiner*—Hsien-ming Lee
(74) *Attorney, Agent, or Firm*—Nixon Peabody LLP; Jeffrey L. Costellia

(57) ABSTRACT

It is an object of the present invention to provide a laser irradiation apparatus being able to crystallize the semiconductor film homogeneously while suppressing the variation of the crystallinity in the semiconductor film and the unevenness of the state of the surface thereof. It is another object of the present invention to provide a method for manufacturing a semiconductor device using the laser irradiation apparatus which can suppress the variation of on-current, mobility, and threshold of TFT, and to further provide a semiconductor device manufactured with the manufacturing method.

A method for manufacturing a semiconductor device comprising the steps of adding the first noble gas to the semiconductor film formed over the insulating surface with the ion doping method and irradiating the semiconductor film with the first noble gas added therein with the laser light in an atmosphere of second noble gas, wherein the magnetic field is applied to the semiconductor film with the first noble gas added when the laser light is irradiated.

40 Claims, 20 Drawing Sheets

U.S. PATENT DOCUMENTS

| | | |
|---|---|---|
| 6,002,523 A | 12/1999 | Tanaka |
| 6,022,458 A | 2/2000 | Ichikawa |
| 6,038,075 A | 3/2000 | Yamazaki et al. |
| 6,071,796 A | 6/2000 | Voutsas |
| 6,429,097 B1 | 8/2002 | Voutsas et al. |
| 6,544,825 B1 | 4/2003 | Yamazaki |
| 6,548,370 B1 | 4/2003 | Kasahara et al. |
| 6,861,338 B2 * | 3/2005 | Maekawa ............. 438/479 |
| 7,067,403 B2 * | 6/2006 | Yamazaki et al. ........ 438/487 |
| 2003/0089911 A1 * | 5/2003 | Kasahara et al. ............ 257/72 |
| 2003/0129790 A1 | 7/2003 | Yamazaki et al. |
| 2003/0148565 A1 * | 8/2003 | Yamanaka ............. 438/200 |
| 2004/0069751 A1 | 4/2004 | Yamazaki et al. |
| 2004/0087116 A1 | 5/2004 | Nakayama |
| 2004/0119955 A1 | 6/2004 | Tanaka |
| 2004/0171237 A1 | 9/2004 | Tanaka et al. |
| 2004/0259387 A1 * | 12/2004 | Yamazaki et al. ......... 438/795 |
| 2006/0237397 A1 | 10/2006 | Yamazaki et al. |

FOREIGN PATENT DOCUMENTS

| | | |
|---|---|---|
| JP | 63-096908 A | 4/1988 |
| JP | 05-267771 A | 10/1993 |
| JP | 07-183540 | 7/1995 |
| JP | 07-187890 | 7/1995 |
| JP | 11-176752 A | 7/1999 |
| JP | 11-261078 A | 9/1999 |
| JP | 2000-138180 A | 5/2000 |
| JP | 2000-182956 A | 6/2000 |
| JP | 2000-294793 A | 10/2000 |
| JP | 2001-223175 A | 8/2001 |
| JP | 2001-223359 A | 8/2001 |
| JP | 2004-039890 | 2/2004 |
| JP | 2004-179356 | 6/2004 |
| JP | 2004-289140 | 10/2004 |

* cited by examiner

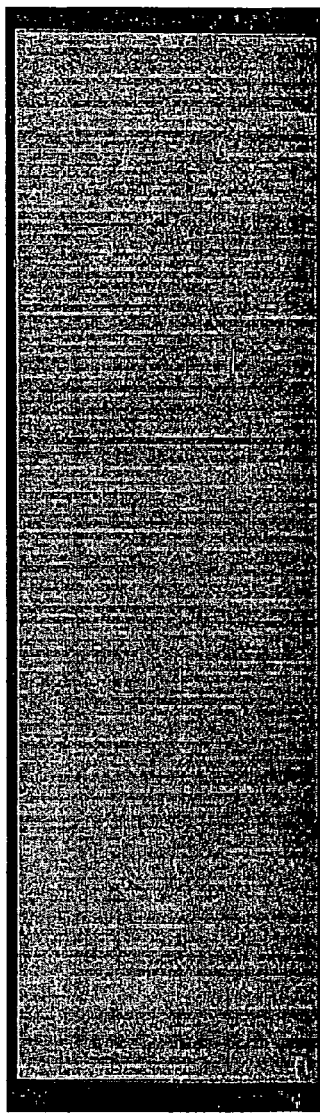
FIG. 18A
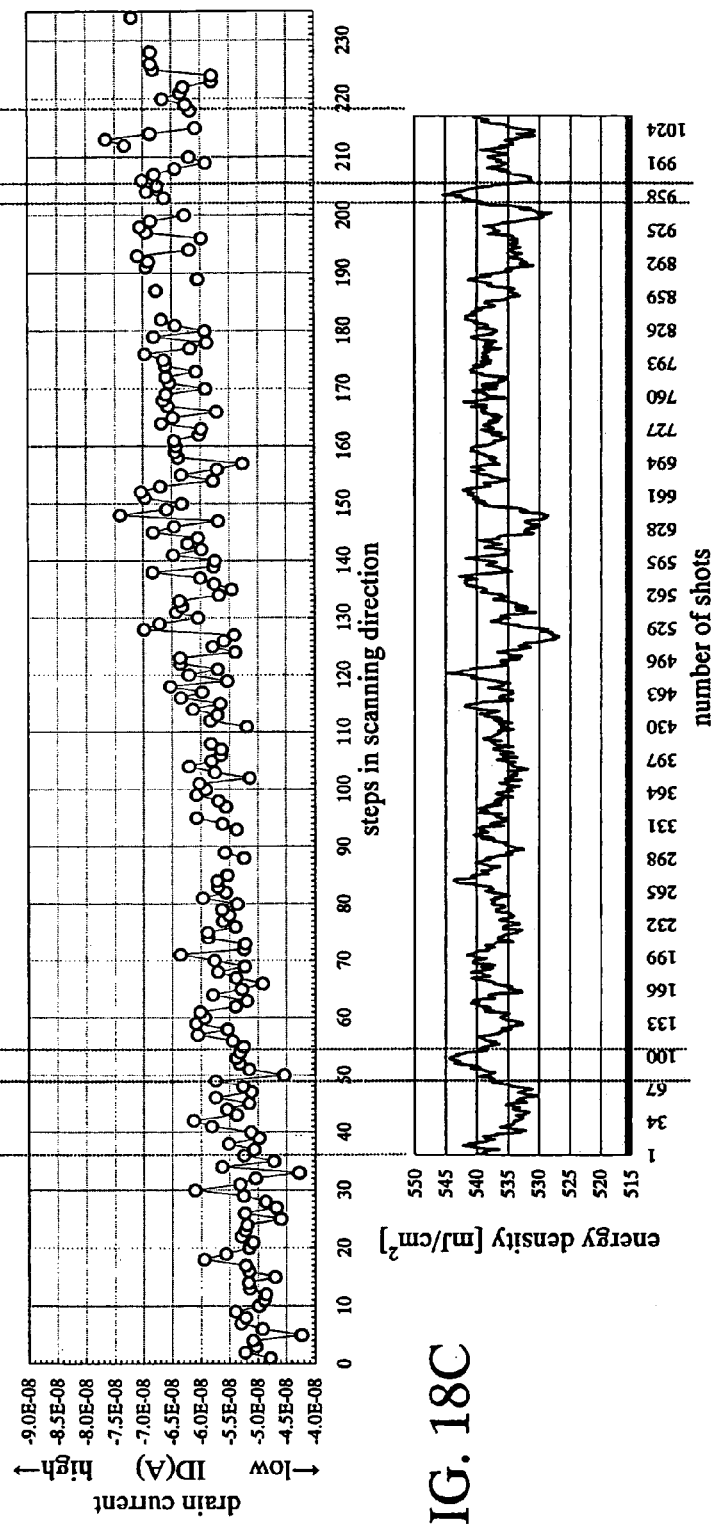
FIG. 18B
FIG. 18C

METHOD FOR MANUFACTURING SEMICONDUCTOR DEVICE, SEMICONDUCTOR DEVICE, AND LASER IRRADIATION APPARATUS

This application is Divisional of U.S. application Ser. No. 10/701,174 filed Nov. 5, 2003 now U.S. Pat. No. 7,160,762.

TECHNICAL FIELD

The present invention relates to a pulsed laser irradiation apparatus or a continuous wave laser irradiation apparatus, which is used for crystallizing a semiconductor film. In addition, the present invention relates to a method for manufacturing a semiconductor device including a process to crystallize a semiconductor film with the laser irradiation apparatus, and to a semiconductor device manufactured with the above manufacturing method.

BACKGROUND ART

Thin film transistor with a poly-crystalline semiconductor film (poly-crystalline TFT) is superior to TFT with an amorphous semiconductor film in its mobility by double digits or more. The poly-crystalline TFT has an advantage that a pixel portion and its peripheral driver circuit in a semiconductor display device can be integrated on the same substrate.

The poly-crystalline semiconductor film can be formed over an inexpensive glass substrate when a laser annealing method is employed. However, the energy of the laser light output from the oscillator fluctuates by at least a few percentage points due to the various reasons. This fluctuation prevents homogeneous crystallization of the semiconductor film. When the crystallinity of the poly-crystalline semiconductor film varies due to the inhomogeneous crystallization, the characteristic of TFT using the poly-crystalline semiconductor film as its active layer, such as on-current or mobility also varies.

For example, in the case of an active matrix light-emitting device in which a light-emitting element and TFT for controlling current supply to the light-emitting element are provided in each pixel, when the on-current of TFT varies, the luminance of the light-emitting element also varies accordingly.

FIG. 18(C) shows the energy density in every shot of pulsed laser light. FIG. 18(B) shows the drain current of TFT for supplying the current to the light-emitting element in the pixel corresponding to every shot. FIG. 18(A) is a photograph of the pixel portion emitting light in fact. It is noted that the photograph of the pixel portion in FIG. 18(A) is extended to the lateral direction in accordance with the number of the steps in the scanning direction and with the number of shots in order to make it easier to understand the relation with the graphs shown in FIG. 18(B) and FIG. 18(C).

The luminance of the light-emitting element is in proportion to the current intensity in the light-emitting element and the current intensity in the light-emitting element is almost equal to the drain current intensity of the TFT supplying the current to the light-emitting element. When FIGS. 18(B) and 18(C) are compared, it is understood that the drain current of TFT corresponding to the shot having high energy density is also high. And when FIGS. 18(A) and 18(B) are compared, it is understood that when the drain current is high, the luminance of the corresponding part in the pixel portion is also high.

Therefore, FIG. 18 shows that the energy fluctuation of the laser light corresponds to stripes appeared as light and shade of luminance in the pixel portion of the light-emitting device.

Moreover, when the semiconductor film is crystallized by irradiating the laser light in the atmosphere, the surface of the semiconductor film becomes somewhat rough. The higher the energy intensity of the laser light is, the rougher the surface of this semiconductor film becomes. The light is scattered to give more brightness in the region whose surface is rougher. Therefore, sometimes the striped light and shade is visible at an interval of several mm due to the energy fluctuation.

It is noted that the state of the surface of the semiconductor film is closely related to the oxygen in the atmosphere at the laser light irradiation according to the patent document 1 shown below.

[Patent document 1]
Published patent application No. 2000-138180 (P.3-P.4)
The patent document 1 describes that the more oxygen the atmosphere contains, the rougher the surface of the semiconductor film crystallized by irradiating the laser light becomes. Moreover, the patent document 1 also describes to spray the semiconductor film with Ar when the laser light is irradiated.

When the surface of the semiconductor film becomes rough, interface state density at the interface between the semiconductor film and the gate insulating film formed so as to contact the semiconductor film becomes high and the threshold voltage shifts to the normally-off side. Therefore, when the state of the surface of the semiconductor film becomes uneven due to the energy fluctuation of the laser light, the interface state density varies at the interface between the semiconductor film and the gate insulating film formed afterward, and as a result the threshold of TFT varies.

DISCLOSURE OF THE INVENTION

Problem to be Solved by the Invention

In view of the problem described above, it is an object of the present invention to provide a laser irradiation apparatus to suppress the variation of the crystallinity of the semiconductor film and the unevenness of the state of the surface thereof, and to make it possible to crystallize the semiconductor film homogeneously. In addition, it is also an object of the present invention to provide a method for manufacturing a semiconductor device using the laser irradiation apparatus which can suppress the variation of the on-current, the mobility, and the threshold of TFT. Furthermore, it is also an object of the present invention to provide a semiconductor device manufactured by the above manufacturing method.

Means for Solving the Problem

The energy density of the laser light is assumed to have a very close relation with the crystallinity of the semiconductor film. However, the present inventors considered that such a wide variation of t he crystallinity as causing the visible variation of the luminance cannot be explained only with the fluctuation of the energy density by a few percentage points. Therefore, the present inventors examined the secondary element caused by the fluctuation of the energy density that affects the crystallinity.

The present inventors focused on the fact that oxygen or nitrogen existing in the atmosphere is mixed into the semiconductor film melted by the laser light.

FIG. 19(A) is a cross-sectional view of the semiconductor film 9000 when pulsed laser light is irradiated in the air. It is considered that the region 9001 irradiated with the laser light in the semiconductor film 9000 is melted completely to be in a state of liquid phase, or is not melted completely to be in a state of partially liquid phase. Since the melted silicon easily reacts with oxygen or nitrogen in the air, a very thin insulating film 9003 such as silicon oxide, silicon nitride, or silicon nitride oxide is formed over the surface of the semiconductor film 9000.

Then FIG. 19(B) is a cross-sectional view of the semiconductor film 9000 when the laser light is scanned from the state shown in FIG. 19(A). In the case of using the pulsed laser light, the region irradiated with the laser light moves discontinuously. In the process to scan the laser light all over the surface of the semiconductor film, as shown in FIG. 19(B), the region 9001 irradiated with the laser light in FIG. 19(A) and the region 9002 irradiated with the laser light in FIG. 19(B) are overlapped partially one another.

In FIG. 19(B), the region 9002 is melted by the irradiation of the laser light. The semiconductor film, which is melted instantaneously by the irradiation of the laser light, seems to be recrystallized at a comparatively rapid rate of several tens m/s when irradiated with the pulsed laser beam, and several cm/s when irradiated with the CW laser beam. Therefore, it is assumed that the impurities exist in the semiconductor film more than the solubility in thermal equilibrium state. Based on this assumption, it is considered that the impurities are easy to be mixed into the semiconductor film from the insulating film that contacts the semiconductor film when the laser light is irradiated. This is notable particularly in the case of the pulsed laser light recrystallizing rapidly.

It is considered that the part of the insulating film 9003 formed over the surface of the region 9001, which is overlapped with the region 9002, is melted and is mixed into the region 9002 as a chip of silicon oxide, silicon nitride, silicon nitride oxide or the like. Therefore, since the thickness of the insulating film 9003 depends on the energy density of the laser light, the fluctuation of the energy density is predicted to lead directly to the fluctuation of the impurity concentration in the semiconductor film.

Moreover, not only the insulating film but also the impurities in the air are likely to be mixed directly. The irradiation time of the laser light for crystallizing the semiconductor film also depends on the scanning speed, and in the case of using the pulsed laser beam, the irradiation time of the laser light ranges approximately from several ns to several tens ns. On the other hand, in the case of using the CW laser beam, the irradiation time is comparatively long, ranging from approximately several μs to several tens μs. Therefore, the CW laser beam melts the semiconductor film longer than the pulsed laser beam. For this reason, it is considered that the impurities are easier to be mixed into the semiconductor film in the case of using the CW laser beam. The higher the temperature of the semiconductor film is, the more easily the impurities in the air dissolve in the semiconductor film, because the solubility of the gas increases. Therefore, it is considered that when the heat given to the semiconductor film differs due to the fluctuation of the energy density, the impurity concentration in the semiconductor film varies.

Since the impurities such as oxygen or nitrogen mixed from a chip of the insulating film and the atmosphere are positive in segregation coefficient in the melted semiconductor film, they are easy to be segregated in the grain boundary in recrystallization. This phenomenon is called grain boundary segregation and is more likely to be seen in the impurities whose solid solubility is lower. The segregated impurities such as oxygen and nitrogen are easy to combine with silicon to form the insulator such as silicon oxide, silicon nitride oxide, or silicon nitride. And the insulating film segregated as a chip or the insulator existing in the grain boundary prevents the carrier from moving in the semiconductor film and this causes the decreasing of the mobility.

Therefore, it is considered that the variation of the impurity concentration in the semiconductor film due to the fluctuation of the energy density causes the variation of the mobility in the semiconductor film.

Consequently, the present inventors tried to enhance the crystallinity by performing the following processes. Ar is doped in the semiconductor film before crystallizing it with the laser light irradiation, and then the semiconductor film is irradiated with the laser light in the atmosphere of Ar. It is noted that the doping element is not limited to Ar and any other zeroth elements (noble gas element) may be employed. Moreover, when the laser light is irradiated, the atmosphere of Ar is not always necessary, and the gas of the zeroth element, or the gas of the zeroth element with hydrogen added may be employed. The zeroth element is appropriate in point of that the zeroth element does not become a dopant because it is neutral in the semiconductor film, and that the zeroth element is hard to form the chemical compound with the element constituting the semiconductor typified by silicon. Particularly, since Ar is inexpensive, the cost required for manufacturing a semiconductor device can be reduced.

The processes from doping Ar up to irradiating the laser light to the semiconductor film are performed in the load lock system chamber in order not to expose the semiconductor film in the atmosphere including oxygen. For example, with the manufacturing apparatus of the multi-chamber system including a chamber to perform the process to form a semiconductor film, a chamber to perform the process to dope Ar to the semiconductor film, and a chamber to irradiate the semiconductor film with the laser light, it is possible to perform a series of processes in order without exposing the semiconductor film to the atmosphere.

The mass of the gas that can melt in a certain amount of liquid is in proportion to the partial pressure of the gas on the liquid. Therefore, when the semiconductor film is doped with Ar or the like in advance and then is irradiated with the laser light in the atmosphere of Ar or the like, it is possible to prevent oxygen and nitrogen from mixing into the semiconductor film from the atmosphere effectively. In addition, when the laser light is irradiated, the insulating film can be prevented from being formed on the surface of the semiconductor film and a chip of the insulating film can be prevented from mixing into the semiconductor film.

Therefore, it is possible to suppress the variation of the impurity concentration due to the fluctuation of the energy density, and to suppress the variation of the mobility of the semiconductor film. In TFT formed using the above semiconductor film, it is also possible to suppress the variation of the on-current in addition to the mobility.

As described in the patent document 1, empirically, when the laser light is irradiated in the, atmosphere including oxygen, the surface of the semiconductor film becomes rough. With the structure of the present invention, however, it is possible to suppress the roughness of the semiconductor surface due to the irradiation of the laser light and to suppress the variation of the threshold caused by the variation of the interface state density.

In addition, when the semiconductor film melts, it is considered that the flow is generated in the semiconductor film due to the temperature gradient or the difference of the surface tension. The present inventors considered that the impurities such as oxygen and nitrogen mixed from the surface of the semiconductor film are distributed in such a way that the impurities are segregated locally due to the flow. The irregularity of the flow in the semiconductor film increases with the temperature of the semiconductor film. As a result, since the impurities are dissolved again microscopically in recrystallization, the interface between the solid phase and the liquid phase becomes inhomogeneous, and thereby the impurities are segregated irregularly.

Consequently in the present invention, a magnetic field is applied to the semiconductor film when the laser light is irradiated in order to suppress the flow. Silicon is semiconductor in a solid phase, while it is conductive material in a liquid phase. When the magnetic field is applied to the conductive material, the current is generated inside the conductor moving across the magnetic lines of force according to Fleming's law, and the conductive material receives a force from a direction opposite to the moving direction by this current. As a result, the viscosity increases to suppress the flow. Therefore, a segregation of the impurities due to the flow can be suppressed and the variation of the mobility and the on-current can be also suppressed.

In addition, it is also considered that when the viscosity of the semiconductor film increases by applying the magnetic field, it is possible to prevent the impurities from mixing into the semiconductor film and to enhance the mobility of the semiconductor film further.

It is noted that the magnetic field may be applied by electromagnetic induction with a coil or the like, or may be applied by a permanent magnet. As a permanent magnet, a neodymium magnet, a samarium-cobalt magnet, an anisotropic ferrite magnet, an isotropic ferrite magnet, an alnico magnet, a NdFeB bonded magnet, or the like can be used.

It is noted that in the present invention, the semiconductor film may be irradiated with the laser light after the catalyst element is added thereto in order to enhance the crystallinity.

Advantageous Effect of the Invention

According to the present invention, oxygen and nitrogen are effectively prevented from mixing into the semiconductor film by doping Ar or the like in the semiconductor film in advance, and by irradiating the laser light in the atmosphere of Ar or the like. Therefore, the variation of the impurity concentration due to the fluctuation of the energy density can be suppressed and the variation of the mobility of the semiconductor film can be also suppressed. Moreover, in TFT formed using the semiconductor film, the variation of the on-current in addition to the mobility can be also suppressed.

Moreover, as described in patent document 1, empirically when the laser light is irradiated in the atmosphere including oxygen, the surface of the semiconductor film becomes rough. When the laser light is irradiated in the atmosphere of Ar or the like, however, the surface of the semiconductor film can be prevented from being rough, and the variation of the threshold due to the variation of the interface state density can be suppressed.

In addition, it becomes possible to suppress the segregation of the impurities due to the flow by applying the magnetic field to the semiconductor film when irradiating the laser light. When the magnetic field is further applied, the viscosity of the semiconductor film is increased so that the impurities are prevented from mixing into the semiconductor film. As a result, the variation of the mobility and the on-current can be suppressed.

BEST MODE FOR CARRYING OUT THE INVENTION

Embodiment Mode 1

A laser irradiation method according to the present invention is explained with reference to FIG. 1. FIG. 1(A) shows an aspect in which a semiconductor film 101 formed over a substrate 100 is irradiated with the laser light. According to the present invention, before the crystallization by the irradiation of the laser light, the zeroth element, which is hard to form a chemical compound with semiconductor and which is neutral in the semiconductor so that it does not function as a dopant, is doped in the semiconductor film 101.

He, Ne, Ar, Kr, Xe, or the like is typically given as the doped zeroth element. As well as doping P or B imparting conductivity to the semiconductor film, the zeroth element can be doped by converting it into plasma and accelerating it by porous electrode. In addition, unlike P and B that are regulated legally, the above gases do not need to be diluted with hydrogen. As a result, throughput can be increased.

For example, in the case of Ar, Ar is doped so that the concentration in the semiconductor film ranges from $1 \times 10^{18}$ to $1 \times 10^{21}$ atoms/cm$^3$, preferably from $5 \times 10^{18}$ to $5 \times 10^{20}$ atoms/cm$^3$. The accelerating voltage affects the concentration distribution of Ar in a direction of the thickness of the semiconductor film 101. Therefore, the acceleration voltage is determined appropriately by the condition in which the concentration is made higher toward the surface side of the film, the concentration is made higher toward the substrate side of the film, or the concentration is made uniform all over the film.

In addition, the semiconductor film 101 is irradiated with the laser light in the atmosphere of the zeroth element described above. It is noted that the zeroth element doped in the semiconductor film and the zeroth element used when the laser light is irradiated do not always have to be the same.

It is noted that the laser light may be irradiated in the atmosphere of the gas of the zeroth element added with hydrogen. In this case, the partial pressure of hydrogen is set in the range of 1 to 3%.

Moreover, in FIG. 1(A), a reference numeral 102 corresponds to a beam spot obtained by the pulsed laser light irradiated to the semiconductor film 101. A relative position of the beam spot 102 to the semiconductor film 101 is moved by scanning the substrate 101 in the direction indicated by an arrow of a continuous line.

A reference numeral 103 corresponds to a magnetic pole of a magnetic circuit that can apply a magnetic field in the semiconductor film 101, particularly in the region where the beam spot 102 is irradiated. The magnetic lines of force in the magnetic field generated by the magnetic pole 103 are indicated with an arrow of a dotted line.

To clarify the relation between the direction of the magnetic lines of force and the scanning direction of the substrate with respect to the semiconductor film 101, FIG. 1(B) is a top view of the semiconductor film 101, and FIG. 1(C) is a cross-sectional view taken along a dotted line A-A' in FIG. 1(B). In FIG. 1(B), the scanning direction of the substrate 100 exists in the surface of the substrate 100 as indicated by an arrow of a continuous line. A relative position of the beam spot 102 to the semiconductor film 101 is moved to the direction indicated by a white arrow by the scanning of the substrate 100.

In addition, the magnetic pole 103 is provided on the side of the substrate 100 opposite to the side irradiated with the laser light. And the magnetic lines of force are directed to the surface of the semiconductor film 101 from the magnetic pole 103.

It is noted that the surface formed with the semiconductor film 101 is not always perpendicular to the direction of the magnetic lines of force. In the present invention, it does not lead to any problems as long as the magnetic component in which the direction of passing magnetic lines of force is almost constant is applied in the part of the semiconductor film 101 irradiated with the beam spot 102.

And the magnetic flux density in the part of the semiconductor film 101 irradiated with the beam spot 102 is set in the range of 1000 G to 10000 G, preferably in the range of 1500 G to 4000 G FIG. 1(B) shows a case in which a surface formed with the semiconductor film 101 is perpendicular to the direction of the magnetic lines of force in the part of the semiconductor film 101 irradiated with the beam spot 102. In this case, the scanning direction of the substrate 100 and the direction of magnetic lines of force are also perpendicular. The direction of the magnetic lines of force, however, is not limited to that shown in FIG. 1(B).

In order to raise the proportion of the region having the homogeneous energy density, it is preferable that the beam spot 102 has a linear, rectangular, or elliptical shape in which a ratio of the length of the major axis thereof with respect to that of the minor axis thereof is five or more. In this embodiment mode, as shown in FIG. 1(B), Wb, which is the length of the beam spot 102 in the direction of its major axis, is made shorter than $W_{m1}$, which is the width of the magnetic pole 103 in the direction of the major axis of the beam spot 102, so that the direction of passing magnetic lines of force can be kept almost constant.

In the present invention, the known pulsed gas laser or pulsed solid laser can be used. For example, a YAG laser, a $YVO_4$ laser, a YLF laser, a $YAlO_3$ laser, a glass laser, a ruby laser, an alexandrite laser, a Ti: sapphire laser, a forsterite laser ($Mg_2SiO_4$), or the like, each of which is doped with Cr, Nd, Er, Ho, Ce, Co, Ti, or Tm can be given. The fundamental wavelength of these lasers depends on the doped material, but the laser light having a wavelength of approximately 1 μm can be obtained as the fundamental wave. A second harmonic, a third harmonic, and a fourth harmonic to the fundamental wave can be obtained through a non-linear optical element.

In the present invention, as described above, oxygen and nitrogen can be prevented from mixing into the semiconductor film effectively by doping Ar or the like in the semiconductor film in advance and by irradiating the laser light in the atmosphere of Ar or the like. Therefore, the variation of the impurity concentration due to the fluctuation of the energy density can be suppressed. Moreover, the variation of the mobility of the semiconductor film can be also suppressed. And in TFT formed using the semiconductor film, the variation of the on-current in addition to the mobility can be suppressed.

As described in patent document 1, empirically when the laser light is irradiated in the atmosphere including oxygen, the surface of the semiconductor film becomes rough. However, when the laser light is irradiated in the atmosphere of Ar or the like, the surface of the semiconductor film can be prevented from being rough, and the variation of the threshold due to the variation of the interface state density can be also suppressed.

Furthermore, when the magnetic field is applied to the semiconductor film when the laser light is irradiated, the segregation of the impurities due to the flow can be suppressed. By further applying the magnetic field, the viscosity of the semiconductor film can be increased, and thereby the impurities are prevented from mixing into the semiconductor film. As a result, it is possible to suppress the variation of the mobility and the on-current.

Although this embodiment mode explained the case in which the pulsed laser light is irradiated, the CW laser light may be also irradiated. FIG. 2(A) is a drawing where the CW laser light is irradiated to the semiconductor film 101 formed over the substrate 100. Moreover, FIG. 2(B) is a top view of the semiconductor film 101 in the case where the CW laser light is irradiated. And FIG. 2(C) is a cross-sectional view taken along the dotted line A-A' in FIG. 2(B). It is noted that the same reference numerals as those in FIG. 1 are used in FIG. 2 in order to clarify the contrast with FIG. 1.

The different point between FIG. 1 and FIG. 2 is that a reference numeral 102 in FIG. 2 corresponds to the beam spot obtained by the CW laser light irradiated to the semiconductor film 101.

The known CW gas laser or CW solid laser can be employed as the laser in FIG. 2. As the gas laser, an Ar laser, a Kr laser, and the like can be given. As the solid laser, a YAG laser, a $YVO_4$ laser, a YLF laser, a $YAlO_3$ laser, a $Y_2O_3$ laser, a glass laser, a ruby laser, an alexandrite laser, a Ti: sapphire laser, and the like can be given. The higher harmonic with respect to the fundamental wave can be obtained through the non-linear optical element.

Particularly when the CW solid laser emitting the second harmonic, the third harmonic, or the fourth harmonic with respect to the fundamental wave is employed, a crystal having a large grain can be obtained. Typically it is preferable to use the second harmonic (532 nm) or the third harmonic (355 nm) of the Nd:$YVO_4$ laser (fundamental wave 1064 nm). Specifically, the laser light emitted from the CW $YVO_4$ laser is converted into the harmonic with an output of 10 W through the non-linear optical element. Moreover, the harmonic can be emitted also by inserting $YVO_4$ crystal and non-linear optical element in the resonator.

Embodiment Mode 2

This embodiment mode explains one mode of the present invention where the magnetic field is applied to the direction different from that shown in FIG. 1 and FIG. 2.

FIG. 3(A) is a top view of the semiconductor film 201, and FIG. 3(B) is a cross-sectional view taken along the dotted line A-A' in FIG. 3(A). It is noted that a reference numeral 201 corresponds to the semiconductor film formed over the substrate 200 in FIGS. 3(A) and 3(B).

The scanning direction of the substrate 200 exists in the surface of the substrate 200 as indicated by an arrow of a continuous line. In addition, a reference numeral 202 corresponds to the beam spot obtained by the pulsed laser light irradiated to the semiconductor film 201. The beam spot 202 to the semiconductor film 201 is moved relatively to the direction indicated by a white arrow by scanning the substrate 200 to the direction indicated by an arrow of a continuous line.

Magnetic poles 203a and 203b correspond to the magnetic pole of a magnetic circuit that can apply the magnetic field to the semiconductor film 201, particularly in the region where the beam spot 202 is irradiated. The magnetic lines of force of the magnetic field generated between the magnetic poles 203a and 203b are indicated by an arrow of a dotted line. The magnetic poles 203a and 203b are provided on the surface of the substrate 200 irradiated with the laser light. And the direction of the magnetic lines of force exists in the surface of the semiconductor film 201. In FIG. 3(A), the scanning direction of the substrate 200 is perpendicular to the direction of the magnetic lines of force in the part of the semiconductor film 201 irradiated with the beam spot 202.

It is noted that the magnetic lines of force are distributed as connecting the magnetic poles 203a and 203b. The magnetic lines of force are almost straight in the space where the distance from the magnetic poles 203a and 203b is shorter, but are curved to have a larger curvature as the distance is longer. Therefore, the scanning direction of the substrate 200 and the direction of the magnetic lines of force are not always perpendicular. In the present invention, it does not lead to any problems as long as the magnetic component in which the direction of passing magnetic lines of force is almost constant is applied in the part of the semiconductor film 201 irradiated with the beam spot 202.

The magnetic flux density in the part of the semiconductor film 201 irradiated with the beam spot 202 is set in the range of 1000 G to 10000 G, preferably in the range of 1500 G to 4000 G.

And in this embodiment mode, as shown in FIG. 3(A), the direction of the passing magnetic lines of force can be kept almost constant in the part of the semiconductor film 201 irradiated with the beam spot 202 by making the length Wb of the beam spot 202 in the direction of its major axis shorter than the distance $W_{m2}$ between the magnetic poles 203a and 203b.

It is noted that the amount of the magnetic field can be controlled by the width of $Wm_2$. It is preferable that $Wm_2$ ranges approximately from 1 mm to 5 mm.

In addition, although this embodiment mode explained the case in which the pulsed laser light is irradiated, the CW laser light may be also irradiated. FIG. 4(A) is a top view of the semiconductor film 201 in the case where the CW laser light is irradiated, and FIG. 4(B) is a cross-sectional view taken along a dotted line A-A' in FIG. 4(A). It is noted that the same reference numerals as those in FIG. 3 are used in FIG. 4 in order to clarify the contrast with FIG. 3.

The different point between FIG. 3 and FIG. 4 is that a reference numeral 202 corresponds to the beam spot obtained by the CW laser light irradiated to the semiconductor film 201.

Embodiment Mode 3

This embodiment mode explains one mode of the present invention in which the magnetic field is applied to the direction different from those in FIG. 1 to FIG. 4.

FIG. 5(A) is a top view of the semiconductor film 301 and FIG. 5(B) is a cross-sectional view taken along a dotted line A-A' in FIG. 5(A). It is noted that a reference numeral 301 corresponds to a semiconductor film formed over a substrate 300 in FIGS. 5(A) and 5(B).

The scanning direction of the substrate 300 exists in the substrate 300 as indicated by an arrow of a continuous line. Moreover, a reference numeral 302 corresponds to the beam spot obtained by the pulsed laser light irradiated to the semiconductor film 301. The position of the beam spot 302 relatively to the semiconductor film 301 is moved to the direction indicated by a white arrow by scanning the substrate 300 in the direction indicated by an arrow of a continuous line.

The magnetic poles 303a and 303b correspond to the magnetic pole of the magnetic circuit that can apply the magnetic field to the semiconductor film 301 particularly to the part irradiated with the beam spot 302. The magnetic lines of force of the magnetic field generated between the magnetic poles 303a and 303b are indicated by an arrow of a dotted line. The magnetic poles 303a and 303b are provided on the surface of the substrate 300 irradiated with the laser light, and the direction of the magnetic lines of force exists in the surface of the semiconductor film 301. And in FIG. 5(A), the scanning direction of the substrate 300 is parallel to and is opposite to the direction of the magnetic lines of force in the part of the semiconductor film 301 irradiated with the beam spot 302.

It is noted that the magnetic lines of force are distributed as connecting the magnetic poles 303a and 303b. The magnetic lines of force are almost straight in the space where the distance from the magnetic poles 303a and 303b is shorter, but are curved to have a larger curvature as the distance is longer. Therefore, the scanning direction of the substrate 300 is not always parallel to the direction of the magnetic lines of force. In the present invention, it does not lead to any problems as long as the magnetic component in which the direction of passing magnetic lines of force is almost constant is applied in the part of the semiconductor film 301 irradiated with the beam spot 302.

The magnetic flux density in the part of the semiconductor film 301 irradiated with the beam spot 202 is set in the range of 1000 G to 10000 G, preferably in the range of 1500 G to 4000 G.

And in this embodiment mode, as shown in FIG. 5(A), the direction of passing magnetic lines of force can be kept almost constant in the part of the semiconductor film 301 irradiated with the beam spot 302 by making the length Wb of the beam spot 302 in the direction of its major axis shorter than the distance $W_{m3}$ between the magnetic poles 303a and 303b.

It is noted that the amount of the magnetic field can be controlled by the width of $W_{m3}$. It is preferable that $W_{m3}$ ranges approximately from 1 mm to 5 mm.

It is noted that as the method for scanning laser light, there are an irradiation system moving type method in which a processing object, which is a substrate here, is fixed while an irradiated position of laser light is moved, an object moving type method in which an irradiated position of the laser light is fixed while a substrate is moved, and a method in which these two methods are combined.

The embodiment modes 1 to 3 explained the case in which the laser irradiation apparatus with the object moving type method employed but the present invention is not limited to this. The present invention can be applied to the laser irradiation apparatus with the irradiation system moving type employed and to the laser irradiation apparatus in which an object moving type and an irradiation system moving type are combined. In any cases, it is premised that the relation between the relative moving direction of the beam spot to the semiconductor film and the direction of the magnetic lines of force can be controlled.

In addition, although the embodiment modes 1 to 3 employ the magnetic field generated between the heterogeneous magnetic poles attracting each other, the present invention is not limited to this. The magnetic field generated between the homogeneous magnetic poles repelling each other may be also employed. For example, when the homogeneous magnetic poles are employed as the magnetic poles 203a and 203b in FIG. 3, the magnetic field can be applied in the direction perpendicular to the semiconductor film 201.

It is noted that this embodiment mode explained the case where the pulsed laser light is irradiated but the CW laser light may be also irradiated. FIG. 6(A) is a top view of the semiconductor film 301 in the case where the CW laser light is irradiated. FIG. 6(B) is a cross-sectional view taken along a dotted line A-A' in FIG. 6(A). It is noted that the same reference numerals as those in FIG. 5 are used in FIG. 6 in order to clarify the contrast with FIG. 5.

The different point between FIG. 5 and FIG. 6 is that a reference numeral 302 corresponds to the beam spot obtained by the CW laser light irradiated to the semiconductor film 301.

It is noted that the direction of the magnetic lines of force is not limited to those indicated in the embodiment modes 1 to 3. The direction thereof may be opposite to those shown in FIG. 1 to FIG. 6, and it may be determined to have an angle so as to be neither vertical nor parallel to both the scanning direction of the laser light and the semiconductor film.

Embodiment Mode 4

This embodiment mode explains the possible combination of the direction of the magnetic lines of force with the scanning direction of the substrate other than those in FIG. 1 to FIG. 6.

FIG. 7(A) shows an aspect where the pulsed laser light is irradiated to a semiconductor film 402 formed over a substrate 401. A reference numeral 403 denotes a beam spot moving relatively to the direction indicated by a white arrow with respect to the semiconductor film 402. The direction of the magnetic lines of force is drawn by a dotted line. In FIG. 7(A), as well as in FIG. 1, the direction of the magnetic lines of force is perpendicular to the surface formed with the semiconductor film 402. The different point from FIG. 1 is that the direction of the magnetic lines of force is opposite to that in FIG. 1 so that the magnetic lines of force is directed to the surface of the substrate 401 with the semiconductor film 402 formed thereon.

Next, FIG. 7(B) shows an aspect where a semiconductor film 412 formed over a substrate 411 is irradiated with the pulsed laser light. A reference numeral 413 is a beam spot moving relatively to the direction indicated by a white arrow with respect to the semiconductor film 412. The direction of the magnetic lines of force is drawn with a dotted line. In FIG. 7(B), as well as in FIG. 5, the direction of the magnetic lines of force exists in the surface formed with the semiconductor film 412, and is parallel to the moving direction of the beam spot 413. The different point from FIG. 5 is that the direction of the magnetic lines of force is opposite to that in FIG. 5 and that the magnetic lines of force are directed oppositely to the moving direction of the beam spot 413.

It is noted that FIG. 7 explained the case in which the pulsed laser light is irradiated, but the CW laser light may be also irradiated. FIG. 8(A) corresponds to the case in which the CW laser light is employed in FIG. 7(A). On the other hand, FIG. 8(B) corresponds to the case in which the CW laser light is employed in FIG. 7(B). In order to clarify the contrast with FIG. 7(A), the same reference numerals as those in FIG. 7(A) are used in FIG. 8(A). Moreover, in order to clarify the contrast with FIG. 7(B), the same reference numerals as those in FIG. 7(B) are used in FIG. 8(B).

The different point between FIG. 7(A) and FIG. 8(A) is that a reference numeral 403 in FIG. 8(A) corresponds to the beam spot obtained by the CW laser light irradiated to the semiconductor film 402.

FIG. 8(C) shows an aspect where a semiconductor film 422 formed over a substrate 421 is irradiated with the CW laser light. A reference numeral 423 denotes a beam spot moving relatively to the direction indicated by a white arrow with respect to the semiconductor film 422. The direction of the magnetic lines of force is drawn with a dotted line. In FIG. 8(C), as well as in FIG. 4(A), the direction of the magnetic lines of force exists in the surface formed with the semiconductor film 422 and is perpendicular to the moving direction of the beam spot 423.

And in FIG. 8(C), after the beam spot is scanned to one direction, the beam spot is moved to the direction perpendicular to the scanning direction and then the laser light is scanned again to the same direction. And by doing these operations in order, the whole surface of the substrate is irradiated with the laser light. In FIG. 8(C), the moving direction of the beam spot, that is after being irradiated to one direction and that is before moving to the next scanning, is indicated by an arrow of a continuous line.

In FIG. 8(C), the moving direction of the beam spot and the direction of the magnetic lines of force are corresponded.

Next, FIG. 8(D) shows an aspect in which a semiconductor film 432 formed over a substrate 431 is irradiated with the CW laser light. A reference numeral 433 denotes a beam spot moving to the direction indicated by a white arrow relatively to the semiconductor film 432. The direction of the magnetic lines of force is drawn by a dotted line. In FIG. 8(D), as well as in the case of FIG. 4(A), the direction of the magnetic lines of force exists in the surface formed with the semiconductor film 432 and is perpendicular to the moving direction of the beam spot 433.

And in FIG. 8(D), after the beam spot is scanned to one direction, the beam spot is moved to the direction perpendicular to the scanning direction and then the laser light is scanned again to the same direction. And by doing these operations in order, the whole surface of the substrate is irradiated with the laser light. In FIG. 8(D), the moving direction of the beam spot, which is after being irradiated to one direction and that is before moving to the next scanning, is indicated by an arrow of a continuous line.

In FIG. 8(D), the moving direction of the beam spot is opposite to the direction of the magnetic lines of force.

Embodiment Mode 5

This embodiment mode specifically explains a method for crystallizing the semiconductor film using the laser irradiation apparatus of the present invention.

First, as shown in FIG. 9(A), a base film 501 is formed on a substrate 500. As the substrate 500, a glass substrate such as a barium borosilicate glass and an alumino-borosilicate glass, a quartz substrate, an SUS substrate, or the like can be used. Moreover, although a substrate made from flexible synthetic resin such as plastic tends to be inferior in heat resistance to the substrate 500, it can be used as long as it can be resistant against the processing heat generated in the manufacturing process.

The base film 501 is provided so that alkaline metal such as Na or alkaline-earth metal included in the substrate 500 may not diffuse into the semiconductor film to have an adverse affect on a characteristic of a semiconductor element. Therefore, the base film 501 is formed of an insulating film such as silicon oxide, silicon nitride, or silicon nitride oxide, which can suppress the diffusion of the alkaline metal or the alkaline-earth metal into the semiconductor film. In this embodiment mode, a silicon nitride oxide film is formed in thickness ranging from 10 nm to 400 nm (preferably from 50 nm to 300 nm) by plasma-CVD method.

It is noted that the base film 501 may be formed in single layer or in laminated layer of a plurality of insulating films or the like. In the case to use the substrate including the alkaline metal or the alkaline-earth metal in any way such as a glass substrate, an SUS substrate, or a plastic substrate, it is effective to provide the base film in order to prevent the diffusion of the impurities. On the other hand, when the diffusion of impurities in the substrate such as a quartz substrate does not lead to any significant problems, the base film does not always have to be provided.

Next, a semiconductor film 502 is formed on the base film 501. The thickness of the semiconductor film 502 is set in the range of 25 nm to 100 nm (preferably in the range of 30 nm to 60 nm). It is noted that the semiconductor film 502 may be amorphous semiconductor or poly-crystalline semiconductor. Moreover, not only silicon but also silicon germanium can be used as the semiconductor. When silicon germanium is used, it is preferable that the concentration of germanium is approximately in the range of 0.01 atomic % to 4.5 atomic %.

Next, the zeroth element is added to the semiconductor film 502 by an ion dope method (ion doping method). This embodiment mode explains an example with Ar used as the zeroth element. For example, in the case of Ar, Ar is added so that the concentration in the semiconductor film ranges from $1\times10^{18}$ atoms/cm$^3$ to $1\times10^{21}$ atoms/cm$^3$, preferably from $5\times10^{18}$ atoms/cm$^3$ to $5\times10^{20}$ atoms/cm$^3$. And the accelerating voltage affects the concentration distribution of Ar in the direction of the thickness of the semiconductor film 502. Therefore, the acceleration voltage is determined appropriately by the condition in which the concentration is made higher toward the surface side of the film, the concentration is made higher toward the substrate side of the film, or the concentration is made uniform all over the film. In this embodiment mode, the accelerating voltage was set to 30 kV.

It is noted that the laser light may be irradiated in the atmosphere of the gas with hydrogen added to the zeroth element. In this case, the partial pressure of hydrogen is set in the range of 1% to 3%.

Next, as shown in FIG. 9(B), the semiconductor film 502 is crystallized with the laser irradiation apparatus of the present invention. In this embodiment mode, the pulsed excimer laser, YAG laser, YVO$_4$ laser, or the like is used. When the YAG laser is used for example, a wavelength of the second harmonic, which is easy to be absorbed in the semiconductor film, is used. And the oscillation frequency is set in the range of 30 kHz to 300 kHz, and the energy density is set in the range of 300 mJ/cm$^2$ to 600 mJ/cm$^2$ (typically in the range of 350 mJ/cm$^2$ to 500 mJ/cm$^2$) and the scanning speed may be set so as to irradiate every several shots on any point.

When the CW laser light is irradiated, a large grain crystal can be obtained by using a solid laser and by using the second harmonic to the fourth harmonic of the fundamental wave. For example, it is desirable to use the second harmonic (532 nm) or the third harmonic (355 nm) emitted from Nd: YVO$_4$ laser (fundamental wave 1064 nm) typically. Specifically, the laser light emitted from a CW YVO$_4$ laser is converted into the harmonic through non-linear optical element and the laser light with an output of 10 W is obtained. In addition, the harmonic can be also emitted by inserting YVO$_4$ crystal and non-linear optical element in the resonator. And it is preferable that the laser light is shaped into rectangular or elliptical on the surface to be irradiated through an optical system and that the semiconductor film 502 is irradiated with the shaped laser light. The energy density here is required in the range of 0.01 MW/cm$^2$ to 100 MW/cm$^2$ (preferably in the range of 0.1 MW/cm$^2$ to 10 MW/cm$^2$). And the laser light is irradiated as moving the amorphous semiconductor film 502 relatively to the laser light at a speed ranging from 10 cm/s to 2000 cm/s.

And in the present invention, the magnetic field is applied with magnetic poles 504 and 505 to the region irradiated with the laser light. In this embodiment mode, the scanning direction of the laser light and the direction of the magnetic lines of force are corresponded. In FIG. 9(B), the moving direction of the laser light relative to the substrate 500 is shown with a white arrow while the direction of the magnetic lines of force is shown with an arrow of a dotted line.

It is noted that the magnetic lines of force are distributed as connecting the magnetic poles 504 and 505. The magnetic lines of force are almost straight in the space where the distance from the magnetic poles 504 and 505 is shorter, but are curved to have a larger curvature as the distance is longer. Therefore, the moving direction of the beam spot is not always parallel to the direction of the magnetic lines of force. In the present invention, it does not lead to any problems as long as the magnetic component in which the direction of passing magnetic lines of force is almost constant is applied in the part 506 of the semiconductor film 502 irradiated with the beam spot.

The magnetic flux density in the region 506 irradiated with the beam spot is in the range of 1000 G to 10000 G, preferably in the range of 1500 G to 4000 G.

The laser light is irradiated in the atmosphere including the gas of the zeroth element for 99.99% or more, preferably 99.9999% or more, in the load lock system chamber. In this embodiment mode, Ar is used as the zeroth element.

It is noted that the zeroth element that is doped and the zeroth element that is used when the laser light is irradiated do not always have to be the same.

The semiconductor film 503 having further enhanced crystallinity is formed by irradiating the semiconductor film 502 with the laser light as described above.

Next, as shown in FIG. 9(C), the semiconductor film 503 is patterned to form island shaped semiconductor films 507 to 509 and various kinds of semiconductor elements, typically TFT, are formed using these island shaped semiconductor films 507 to 509.

When TFT is manufactured, for example, a gate insulating film is formed so as to cover the island shaped semiconductor films 507 to 509. As the gate insulating film, silicon oxide, silicon nitride, silicon nitride oxide, or the like can be used. The gate insulating film can be formed by the plasma-CVD method, the sputtering method, or the like.

Next, a gate electrode is formed by forming a conductive film on the gate insulating film and patterning the conductive film. And the gate electrode or resist being formed and patterned is used as a mask, and the impurities imparting n-type or p-type conductivity are added to the island shaped semiconductor films 507 to 509 to form a source region, a drain region, furthermore an LDD region, and the like.

TFT can be formed through such a series of processes. It is noted that the method for manufacturing the semiconductor device in the present invention is not limited to the process for manufacturing TFT described above following after forming the island shaped semiconductor films. The variation of the on-current, the threshold, and the mobility between the elements can be suppressed when the semiconductor film crystallized with the laser irradiation method according to the present invention is employed as an active layer of TFT.

Embodiment Mode 6

Unlike the embodiment mode 5, this embodiment mode explains an example in which the crystallization method by the laser irradiation apparatus of the present invention is combined with a crystallization method by the catalyst element.

First, the processes from forming the semiconductor film 502 up to doping the semiconductor film 502 with the zeroth element are performed in reference to FIG. 9(A) in the embodiment mode 5. Next, as shown in FIG. 10(A), the surface of the semiconductor film 502 is applied with nickel acetate solution including Ni in the range of 1 ppm to 100 ppm in weight with spin coating method. It is noted that the catalyst may be added not only by the spin coating method but also by the sputtering method, the vapor deposition method, the plasma process, or the like.

Next, a heating process was performed for 4 hours to 24 hours, at a temperature ranging from 500° C. to 650° C., for example for 14 hours at a temperature of 570° C. This heating process forms the semiconductor film 502 in which the crystallization is promoted in the vertical direction toward the substrate 500 from the surface with nickel acetate solution applied thereon. (FIG. 10(A))

It is noted that in this embodiment mode nickel (Ni) is used as the catalyst element, but the other element such as germanium (Ge), Ferrum (Fe), Palladium (Pd), Tin (Sn), Lead (Pb), Cobalt (Co), Platinum (Pt), Copper (Cu), or Gold (Au) may be also used.

Next, as shown in FIG. 10(B), the semiconductor film 520 is crystallized with the laser irradiation apparatus of the present invention to form a semiconductor film 521. In this embodiment mode, a pulsed excimer laser, YAG laser, $YVO_4$ laser, or the like is used. When the YAG laser is used for example, a second harmonic that is easy to be absorbed in the semiconductor film is used. And the oscillation frequency is set in the range of 30 kHz to 300 kHz, and the energy density is set in the range of 300 mJ/cm$^2$ to 600 mJ/cm$^2$ (typically in the range of 350 mJ/cm$^2$ to 500 mJ/cm$^2$) and the scanning speed is set so as to be able to irradiate every several shots on any point.

In addition, when a CW $YVO_4$ laser is used, for example, the laser light is shaped into rectangular or elliptical on the surface to be irradiated and the semiconductor film 520 is irradiated with the shaped laser light. The energy density is necessary in the range of 0.01 MW/cm$^2$ to 100 MW/cm$^2$ (preferably in the range of 0.1 MW/cm$^2$ to 10 MW/cm$^2$). And the amorphous semiconductor film 502 is irradiated with the laser light by moving the amorphous semiconductor film 502 relatively to the laser light at a speed ranging from 10 cm/s to 2000 cm/s.

And in the present invention, the magnetic field is applied to the region irradiated by the laser light with a magnetic pole 527 from the side of the substrate 500 opposite to the side of the substrate 500 with the semiconductor film 520 formed thereon. In this embodiment mode, both the scanning direction of the laser light and the surface formed with the semiconductor film 520 are made perpendicular to the direction of the magnetic lines of force in the magnetic field. In FIG. 10(B), the moving direction of the laser light relative to the substrate 500 is drawn with a white arrow, while the direction of the magnetic lines of force is drawn with an arrow of a dotted line.

It is noted that the surface with the semiconductor film 520 formed is not necessarily perpendicular to the direction of the magnetic lines of force. In the present invention, it does not lead to any problems as long as the magnetic component where the direction of passing magnetic lines of force is almost constant is applied in the part 528 of the semiconductor film 520 irradiated with a beam spot.

And the magnetic flux density in the part 528 irradiated with the beam spot is set in the range of 1000 G to 10000 G, preferably in the range of 1500 G to 4000 G.

The laser light is irradiated in the atmosphere including the zeroth element gas for 99.99% or more, preferably 99.9999% or more, in the load lock system chamber. In this embodiment mode, Ar is used as the zeroth element.

It is noted that the zeroth element that is doped and the zeroth element that is used when the laser light is irradiated do not always have to be the same.

The semiconductor film 521 whose crystallinity is further enhanced is formed by irradiating the semiconductor film 520 with the laser light as described above.

It is noted that the catalyst element (Ni here) is supposed to be included at a concentration of approximately $1 \times 10^{19}$ atoms/cm$^3$ inside the semiconductor film 521 that is crystallized with the catalyst element as shown in FIG. 10(B). Next, the catalyst element existing in the semiconductor film 521 is gettered.

First, an oxide film 522 is formed over the surface of the semiconductor film 521 as shown in FIG. 10(C). By forming the oxide film 522 having a thickness ranging from 1 nm to 10 nm, the surface of the semiconductor film 521 can be prevented from becoming rough in the following etching process.

The oxide film 522 can be formed by the known method. For example, the oxide film 522 may be formed by oxidizing the surface of the semiconductor film 521 with ozone water or with the solution in which hydrogen peroxide solution is mixed with sulfuric acid, hydrochloric acid, nitric acid, or the like. Alternatively, the oxide film 522 may be formed by the plasma process, heating process, ultraviolet ray irradiation, or the like in the atmosphere including oxygen. Moreover, the oxide film 522 may be formed by the plasma-CVD method, the sputtering method, the vapor deposition method, or the like.

A semiconductor film 523 for the gettering including the noble gas element not less than $1 \times 10^{20}$ atoms/cm$^3$ is formed in thickness from 25 nm to 250 nm on the oxide film 522 by the sputtering method. It is desirable that the mass density of the semiconductor film 523 for the gettering is lower than that of the semiconductor film 521 in order to increase the selecting ratio to the semiconductor film 521 when being etched.

As the noble gas element, one kind or plural kinds selected from the group consisting of Helium (He), Neon (Ne), Argon (Ar), Krypton (Kr), and Xenon (Xe) are used.

Next the gettering is performed through the heating process with the furnace annealing method or the RTA method. When the furnace annealing method is employed, the heating process is performed for 0.5 hours to 12 hours at a temperature ranging from 450° C., to 600° C. in the atmosphere of nitrogen. When the RTA method is employed, a lamp light source for heating is turned on for 1 to 60 seconds, preferably in the range of 30 seconds to 60 seconds, which is repeated from 1 time to 10 times, preferably from 2 times to 6 times. The lamp light source may have any luminance intensity, but the luminance intensity is set so that the semiconductor film is heated instantaneously at a temperature ranging from 600° C. to 1000° C., preferably from 700° C., to 750° C.

Through the heating process, the catalyst element inside the semiconductor film 521 is moved to the semiconductor film 523 for the gettering due to the diffusion as indicated by an arrow, and the catalyst element is thus gettered.

Next, the semiconductor film 523 for the gettering is removed by etching selectively. The etching process is performed by dry etching with $ClF_3$ not applying plasma, or by wet etching with alkali solution such as the solution including hydrazine or tetraethylammonium hydroxide (chemical formula $(CH_3)_4NOH$). On this occasion, the oxide film 522 prevents the oxide film 521 from being etched.

Next, the oxide film 522 is removed by hydrofluoric acid.

Next, the semiconductor film 521 after removing the oxide film 522 is patterned to form the island shaped semiconductor films 524 to 526. (FIG. 10(D))

It is noted that the gettering process in the present invention is not limited to the method described in this embodiment mode. The catalyst element in the semiconductor film may be reduced with the other method.

Next, various semiconductor elements, typically TFT, are formed using these island shaped semiconductor films 524 to 526.

It is noted that the crystallinity of the semiconductor film can be more enhanced compared with the case in the embodiment mode 5 by crystallizing the semiconductor film with the irradiation of the laser light after crystallizing it with the catalyst element as described in this embodiment mode. In the embodiment mode 5, the crystallization is promoted in such a way that crystal nucleus arises randomly after being irradiated with the laser light. On the other hand, in this embodiment mode, the crystal formed in the crystallization by the catalyst element stays as it is without being melted by the irradiation of the laser light in the side closer to the substrate and the crystallization is promoted by having the crystal as its crystal nucleus. As a result, the crystallization by the irradiation of the laser light is easy to be promoted from the substrate side to the surface uniformly, and thus the surface is prevented from becoming rough compared with the case of the embodiment mode 5. Therefore, the variation of the characteristic of the semiconductor element formed afterward, typically TFT, can be more suppressed.

It is noted that this embodiment mode explained the process to promote crystallization by performing the heating process after the catalyst element is added, and to further enhance crystallinity by irradiating the laser light. However, the present invention is not limited to this, and the heating process may be omitted. Specifically, after adding the catalyst element, the laser light may be irradiated instead of the heating process in order to enhance the crystallinity.

Embodiment Mode 7

This embodiment mode, unlike the embodiment mode 6, explains an example in which the crystallizing method with the laser irradiation apparatus according to this invention is combined with the crystallizing method with the catalyst element.

Initially, the processes from forming the semiconductor film 502 up to doping the zeroth element to the semiconductor film 502 are performed with reference to FIG. 9(A) in the embodiment mode 5. Next, as shown in FIG. 11(A), a mask 540 having an opening is formed on the semiconductor film 502. And the nickel acetate solution including Ni in the range of 1 ppm to 100 ppm in weight is applied to the surface of the semiconductor film 502 by the spin coating method. It is noted that the method for adding the catalyst element is not limited to this, and the sputtering method, the vapor deposition method, the plasma process, or the like can be also employed. Applied nickel acetate solution contacts the semiconductor film 502 in the opening of the mask 504. (FIG. 11(A))

Next, the heating process is performed for 4 hours to 24 hours at a temperature ranging from 500° C. to 650° C., for example for 14 hours at a temperature of 570° C. This heating process forms a semiconductor film 530 in which the crystallization is promoted from the surface with the nickel acetate solution applied thereon as indicated by an arrow of a continuous line. (FIG. 11(A))

It is noted that the catalyst element cited in the embodiment mode 6 can be used as the catalyst element.

Next, after the mask 540 is removed, the semiconductor film 530 is crystallized with the laser irradiation apparatus of the present invention as shown in FIG. 11(B). In this embodiment mode, a pulsed excimer laser, YAG laser, YVO$_4$ laser or the like can be used. When the YAG laser is used for example, a second harmonic, which is easy to be absorbed in the semiconductor film, is used. And the oscillation frequency is set in the range of 30 kHz to 300 kHz, and the energy density is set in the range of 300 mJ/cm$^2$ to 600 mJ/cm$^2$ (typically in the range of 350 mJ/cm$^2$ to 500 mJ/cm$^2$) and the scanning speed may be set so as to be able to irradiate every several shots on any point.

For example, when the CW YVO$_4$ laser is employed, the laser light is shaped into rectangular or elliptical on the surface to be irradiated and the semiconductor film 530 is irradiated with the shaped laser light. The energy density is required in the range of approximately 0.01 MW/cm$^2$ to 100 MW/cm$^2$ (preferably in the range of 0.1 MW/cm$^2$ to 10 MW/cm$^2$). And the laser light is irradiated as moving the amorphous semiconductor film 530 relatively to the laser light at a speed ranging from 10 cm/s to 2000 cm/s.

And in the present invention, the magnetic field is applied with magnetic poles 541 and 542 to the region irradiated with the laser light. In this embodiment mode, the scanning direction of the laser light and the direction of the magnetic lines of force are corresponded. In FIG. 11(B), the moving direction of the laser light relative to the substrate 500 is shown with a white arrow while the direction of the magnetic lines of force is shown with an arrow of a dotted line.

It is noted that the magnetic lines of force are distributed as connecting the magnetic poles 541 and 542. The magnetic lines of force are almost straight in the space where the distance from the magnetic poles 541 and 542 is shorter, but are curved to have a larger curvature as the distance is longer. Therefore, the moving direction of the beam spot is not always parallel to the direction of the magnetic lines of force. In the present invention, it does not lead to any problems as long as the magnetic component in which the direction of passing magnetic lines of force is almost constant is applied in the part 538 of the semiconductor film 530 irradiated with the beam spot.

The magnetic flux density in the region 538 irradiated with the beam spot is set in the range of 1000 G to 10000 G, preferably in the range of 1500 G to 4000 G.

The laser light is irradiated in the atmosphere including the zeroth element gas for 99.99% or more, preferably 99.9999% or more, in the load lock system chamber. In this embodiment mode, Ar is used as the zeroth element.

It is noted that the zeroth element that is doped and the zeroth element that is used when the laser light is irradiated do not always have to be the same.

A semiconductor film 531 having further enhanced crystallinity is formed by irradiating the semiconductor film 530 with the laser light as described above.

It is noted that the semiconductor film 531 crystallized with the catalyst element is supposed to include the catalyst element (Ni here) as shown in FIG. 11(B) at a concentration of approximately $1 \times 10^{19}$ atoms/cm$^3$. Sequentially the catalyst element existing in the semiconductor film 531 is gettered.

As shown in FIG. 11(C), a silicon oxide film 532 for a mask is formed 150 nm in thickness so as to cover the semiconductor film 531. And then an opening is provided by patterning the silicon oxide film 532 in order to expose a part of the semiconductor film 531. Then, phosphorous is added to provide a region 533 in which phosphorous is added in the semiconductor film 531.

When the heating process is performed in this state for 5 hours to 24 hours at a temperature ranging from 550° C. to 800° C. in the atmosphere of nitrogen, for example for 12 hours at a temperature of 600° C., the region 533 with phosphorous added in the semiconductor film 531 works as a gettering site. As a result, the catalyst element left in the semiconductor film 531 is moved in the gettering region 533 with phosphorous added therein. (FIG. 11(C))

And the concentration of the catalyst element in the rest of the regions in the semiconductor film 530 can be decreased to $1 \times 10^{17}$ atms/cm$^3$ or less by removing the region 533 with phosphorous added therein by means of etching.

After removing the silicon oxide film 532 for the mask, the semiconductor film 531 is patterned to form island shaped semiconductor films 534 to 536. (FIG. 11(D))

It is noted that the gettering process in the present invention is not limited to the method shown in this embodiment mode. The other method may be employed in order to decrease the catalyst element in the semiconductor film.

Next, various kinds of semiconductor elements, typically TFT, are formed using the island shaped semiconductor films 534 to 536.

It is noted that the crystallinity of the semiconductor film can be more enhanced compared with the case of the embodiment mode 5, by crystallizing the semiconductor film with the irradiation of the laser light after crystallizing it with the catalyst element as described in this embodiment mode. In the embodiment mode 5, the crystallization is promoted in such a way that crystal nucleus arises randomly after being irradiated with the laser light. On the other hand, in this embodiment mode, the crystal formed in the crystallization by the catalyst element stays as it is without being melted by the irradiation of the laser light in the side closer to the substrate and the crystallization is promoted by having the crystal as its crystal nucleus. As a result, the crystallization by the irradiation of the laser light is easy to be promoted from the substrate side to the surface uniformly, and thus the surface is prevented from becoming rough compared with the case in the embodiment mode 5. Therefore, the variation of the characteristic of the semiconductor element formed afterward, typically TFT, can be more suppressed.

It is noted that this embodiment mode explained the structure to promote the crystallization by performing the heating process after the catalyst element is added, and to further enhance crystallinity by the irradiation of the laser light. However, the present invention is not limited to this, and the heating process may be omitted. Specifically, after adding the catalyst element, the laser light may be irradiated instead of the heating process in order to enhance the crystallinity.

Embodiment Mode 8

This embodiment explains the structure of the pulsed laser irradiation apparatus including the load lock system chamber.

FIG. 12 shows the structure of the laser irradiation apparatus in this embodiment mode. A laser irradiation chamber 1206 is surrounded by a barrier diffusion 1230. It is noted that since the laser light is highly directional and has the high energy density, it is preferable that the barrier diffusion 1230 has the characteristic of absorbing the reflected light in order to prevent the reflected light from irradiating an inappropriate region. In addition, cooling water may be circulated in the barrier diffusion in order to prevent the rise of the temperature due to the absorption of the reflected light.

Moreover, as shown in FIG. 12, means 1240 for heating the barrier diffusion (barrier diffusion heating means) may be provided to heat the barrier diffusion when the laser irradiation chamber is evacuated.

And a gate 1210 corresponds to a transferring gate for transferring the substrate to the laser irradiation chamber 1206. The gas inside the laser irradiation chamber 1206 can be evacuated by an evacuation system 1231 connected to an evacuation port 1211. The noble gas can be supplied into the laser irradiation chamber 1206 by a noble gas supplying system 1250 connected to a supply port 1251.

A reference numeral 1212 denotes a stage on which the substrate 1203 is mounted. The position of the substrate 1203 can be controlled by moving the stage according to position controlling means 1242 and thus the irradiation position of the laser light can be moved. As shown in FIG. 12, means 1241 for heating the substrate (substrate heating means) may be provided in the stage 1212.

An opening 1232 provided in the barrier diffusion 1230 is covered by a window 1233 to transmit the laser light (transmission window). It is preferable that the transmission window is made of the material that is hard to absorb the laser light. For example the quarts or the like is appropriate. A gasket 1236 is provided between the transmission window 1233 and the barrier diffusion 1230. The gasket 1236 can prevent the atmosphere from entering the laser irradiation chamber from the space between the transmission window 1233 and the barrier diffusion 1230.

Initially, the substrate 1203 with the semiconductor film formed thereon is transferred. After the gate 1210 is closed, the laser irradiation chamber 1206 is kept with the atmosphere of the noble gas by using the evacuation system 1231 and the noble gas supplying system 1250.

The beam spot of the laser light oscillated from the laser oscillator 1213 is shaped through an optical system 1214 and the substrate 1203 is irradiated with the shaped beam spot. The incidence angle θ is preferably set more than 0°, more preferably in the range of 5° to 30°, in order to prevent the return light and to perform the uniform irradiation.

A reference numeral 1252 denotes the magnetic pole of the magnetic circuit, which applies the magnetic field to the semiconductor film formed over the substrate 1203. It is noted that though the magnetic field is applied from the side of the substrate 1203 irradiated with the laser light, the present invention is not limited to this. The magnetic field may be applied from the side of the substrate 1203 opposite to the side thereof irradiated with the laser light by incorporating the magnetic pole 1252 into the stage 1212.

It is noted that the laser irradiation chamber 1206 shown in FIG. 12 may be one chamber included in the multi-chambers. When the chamber for doping the noble gas element to the semiconductor film is provided so that a series of the processes from doping the noble gas element up to crystallizing with the laser light are performed in the multi-chamber without exposing it to the air, it is possible to prevent the impurities from mixing into the semiconductor film more effectively.

It is noted that when the laser irradiation apparatus is employed for crystallizing the semiconductor film, it is possible to make the crystallinity of the semiconductor film more uniform. The method for manufacturing the semiconductor device in the present invention can be applied to manufacture the integrated circuit and the semiconductor display device. Particularly, when the present invention is applied to the semiconductor element such as the transistor provided in the pixel portion of the semiconductor display device such as the liquid crystal display device, the light-emitting device having the light-emitting element typified by the organic light-emitting element equipped in each pixel, DMD (Digital Micromirror Device), PDP (Plasma Display Panel), or FED (Field Emission Display), it is possible to prevent the horizontal stripes from being visible due to the energy distribution of the laser light irradiated to the pixel portion thereof.

It is noted that FIG. 12 shows the pulsed laser irradiation apparatus, but a CW laser irradiation apparatus may be also applicable in this embodiment mode. FIG. 13 shows the CW laser irradiation apparatus in this embodiment. The same reference numerals as those in FIG. 12 are used, but the structure of the optical system 1214 is different in FIG. 12 and in FIG. 13.

Embodiment Mode 9

One mode of the laser irradiation apparatus of the present invention is explained.

FIG. 14 shows a structure of the laser irradiation apparatus of this embodiment mode. Laser light oscillated from a laser oscillation apparatus 1500 is changed into linearly-polarized light through a polarizer 1507, and then is incident into a beam expander 1508. On the other hand, laser light oscillated from a laser oscillation apparatus 1501 is changed into linearly-polarized light through a polarizer 1504 and then is changed in its polarization angle by 90° through a wave plate 1506. Then, the laser light is incident into the beam expander 1508 together with the laser light oscillated from the laser oscillation apparatus 1500 by the use of the polarizer 1507.

It is noted that this embodiment mode employs a shutter 1502 for shutting out the laser light provided between the laser oscillation apparatus 1500 and the polarizer 1507, but the shutter does not always have to be provided. Moreover, a shutter 1503 for shutting out the laser light is provided between the laser oscillation apparatus 1501 and the polarizer 1504, but the shutter does not always have to be provided.

The beam expander 1508 can suppress the divergence of the incident laser light and adjust the size of the beam spot.

The laser light emitted from the beam expander 1508 is converged through a cylindrical lens 1509 so that the beam spot thereof becomes rectangular, elliptical, or linear. The converged laser light is reflected by a mirror 1510 and then is incident into a lens 1511. The incident laser light is converged again through the lens 1511 and is irradiated to a substrate 1514 in a laser irradiation chamber 1513. This embodiment mode employed an f θ telecentric lens as the lens 1511.

In this embodiment mode, the optical system includes the polarizers 1504 and 1507, the beam expander 1508, a wave plate 1506, the shutters 1502 and 1503, the cylindrical lens 1509, the mirror 1510, and the lens 1511.

In the laser irradiation chamber 1513, the substrate 1514 is mounted on a stage 1515 controlled by three position controlling means 1516 to 1518. Specifically, the position controlling means for φ direction 1516 can rotate the stage 1515 in the horizontal plane. In addition, the position controlling means for X direction 1517 can move the stage 1515 to X direction in the horizontal plane. Furthermore, the position controlling means for Y direction 1518 can move the stage 1515 to Y direction in the horizontal plane. These position controlling means are controlled with a central processing apparatus 1519.

A reference numeral 1520 denotes a magnetic pole included in the magnetic circuit, which can apply a magnetic field to the semiconductor film formed over the substrate 1514. It is noted that though the magnetic field is applied from the side of the substrate 1514 irradiated with the laser light in this embodiment mode, the present invention is not limited to this. This magnetic pole 1520 may be incorporated in the stage 1515 so that the magnetic field is applied from the side of the substrate 1514 opposite to the side thereof irradiated with the laser light.

It is noted that a monitor 1512 using light-sensitive element such as CCD may be provided to know the exact position of the substrate as described in this embodiment mode.

It is noted that though FIG. 14 shows the pulsed laser irradiation apparatus, the CW laser irradiation apparatus may be employed as the laser irradiation apparatus of the present invention. FIG. 15 shows the CW laser irradiation apparatus in this embodiment. The same reference numerals as those in FIG. 14 are used in FIG. 15 though the lens 1511 to be used is different in FIG. 14 and FIG. 15. The angle of the mirror 1510 in FIG. 14 is changeable while the mirror 1510 in FIG. 15 is fixed.

Embodiment Mode 10

This embodiment mode explains the optical system included in the laser irradiation apparatus of the present invention.

FIG. 16(A) shows the optical system in this embodiment mode, which is used in pulse oscillation and in CW oscillation. The optical system shown in FIG. 16(A) has two cylindrical lenses 701 and 702. The beam spot of the laser light being incident from the direction indicated by an arrow is shaped through the two cylindrical lenses 701 and 702, and then the shaped beam spot is irradiated to the processing object 703. It is noted that the cylindrical lens 702 positioned closer to the processing object 703 has a shorter focal length than the cylindrical lens 701. In order to avoid the return light and to perform uniform irradiation, the incidence angle of the laser light to the processing object 703 is set to be more than 0°, preferably in the range of 5° to 30°.

FIG. 16(B) shows the optical system in this embodiment mode, which is used in pulse oscillation and in CW oscillation. The optical system shown in FIG. 16(B) includes a mirror 705 and a planoconvex spherical lens 706. After the laser light being incident from the direction indicated by an arrow is reflected on the mirror 705, its beam spot is shaped through the planoconvex spherical lens 706, and then the shaped beam spot is irradiated to a processing object 707. It is noted that a designer can determine the radius of curvature of the planoconvex spherical lens appropriately. In addition, in order to avoid the return light and to perform uniform irradiation, the incidence angle of the laser light to the processing object 707 is set to be more than 0°, preferably in the range of 5° to 30°.

FIG. 16(C) shows the optical system in this embodiment mode, which is used in pulse oscillation and in CW oscillation. The optical system shown in FIG. 16(C) includes mirrors 710, 711, lenses 712, 713, and 714. After the laser light being incident from the direction indicated by an arrow is reflected on the mirrors 710 and 711, its beam spot is shaped through the lenses 712, 713, and 714, and then the shaped beam spot is irradiated to a processing object 715. It is noted that in order to avoid the return light and to perform uniform irradiation, the incidence angle of the laser light to the processing object 715 is set to be more than 0°, preferably in the range of 5° to 30°.

FIG. 16(D) shows the optical system in this embodiment mode, which is used in CW oscillation. The optical system shown in FIG. 16(D) is the optical system for combining four beam spots to form one beam spot. The optical system shown in FIG. 16(D) includes six cylindrical lenses 717 to 722. Four of the laser light being incident from the direction indicated by an arrow are incident into four cylindrical lenses 719 to 722 respectively. The two beam spots of the laser light shaped through the cylindrical lenses 719 and 721 are shaped again through the cylindrical lens 717 and then the shaped beam spot is irradiated to the processing object 723. On the other hand, the other two beam spots of the laser light shaped through the cylindrical lenses 720 and 722 are shaped again through the cylindrical lens 718, and then the shaped beam spot is irradiated to the processing object 723.

Each beam spot of the laser light on the processing object 723 is combined so as to form one beam spot by overlapping each other partially.

It is possible for a designer to determine the focal length of each lens and the incidence angle appropriately. However, the focal length of the cylindrical lenses 717 and 718, which are positioned closest to the processing object 723, are made shorter than that of the cylindrical lenses 719 to 722. For example, the focal length of the cylindrical lenses 717 and 718, which are positioned closest to the processing object 723, is set to be 20 mm. And the focal length of the cylindrical lenses 719 to 722 is set to be 150 mm. Each lens is arranged so that the incidence angle of the laser light from the cylindrical lenses 717 and 718 to the processing object 723 is 25° and the incidence angle of the laser light from the cylindrical lenses 719 to 722 to the cylindrical lenses 717 and 718 is 10° in this embodiment. It is noted that in order to avoid the return light and to perform uniform irradiation, the incidence angle of the laser light to the processing object 723 is set to be more than 0°, preferably in the range of 5° to 30°.

FIG. 16(D) shows an example to combine four beam spots. In this case, there are four cylindrical lenses provided to correspond with four laser oscillators, and there are two cylindrical lenses provided to correspond with the four cylindrical lenses. The number of beam spots to be combined is not limited to this, and the number thereof may be no fewer than 2, nor more than 8. When n (n=2,4,6,8) number of the beam spots are combined, n number of the cylindrical lenses are provided to correspond with n number of the laser oscillators respectively, and n/2 number of the cylindrical lenses are provided to correspond with n number of the cylindrical lenses. When n (n=3,5,7) number of the beam spots are combined, n number of the cylindrical lenses are provided to correspond with n number of the laser oscillators respectively, and (n+1)/2 number of the cylindrical lenses are provided to correspond with n number of the cylindrical lenses.

When five or more of the beam spots are overlapped, it is desirable that the fifth and subsequent laser light is irradiated from the side of the rear surface of the substrate in consideration of the position of the optical system, interference, and the like. Moreover, the substrate needs to be transparent.

It is desirable that an incidence angle θ of the laser light satisfies the inequality of θ≧arctan (W/2d). In the inequality, it is defined that an incidence plane is perpendicular to the surface to be irradiated and is including a longer side or a shorter side of the beam spot assuming that the beam spot is rectangular in shape. Moreover, in the inequality, "W" is a length of the longer side or the shorter side included in the incidence plane and "d" is a thickness of the substrate transparent to the laser light, which is placed at the surface to be irradiated. It is defined that a track of the laser light projected to the incidence plane has an incidence angle θ when the track is not on the incidence plane. When the laser beam is made incident at an angle θ, it is possible to perform uniform irradiation of the laser beam without interference of reflected light from a surface of the substrate with reflected light from a rear surface of the substrate. The theory above is considered assuming that a refractive index of the substrate is 1. In fact, the substrate has a refractive index of 1.5 approximately, and a larger value than the angle calculated in accordance with the above theory is obtained when the value around 1.5 is taken into account. However, since the laser beam on the surface to be irradiated has energy attenuated at opposite sides in the longitudinal direction thereof, the interference has a small influence on opposite sides and the value calculated in accordance with the inequality is enough to obtain the effect of attenuating the interference.

It is noted that the optical system in the laser irradiation apparatus of the present invention is not limited to the structure shown in this embodiment mode.

Embodiment 1

A structure of the pixel in the light-emitting device, one of the semiconductor devices formed with the laser irradiation apparatus of the present invention is explained with reference to FIG. 17.

In FIG. 17, a base film 6001 is formed on a substrate 6000, and a transistor 6002 is formed on the base film 6001. The transistor 6002 has an active layer 6003, a gate electrode 6005, and a gate insulating film 6004 sandwiched between the active layer 6003 and the gate electrode 6005.

A poly-crystalline semiconductor film crystallized with the laser irradiation apparatus of the present invention is used as the active layer 6003. It is noted that not only silicon but also silicon germanium may be employed as the active layer. When the silicon germanium is employed, it is preferable that the concentration of germanium is approximately in the range of 0.01 atomic % to 4.5 atomic %. Alternatively silicon with carbon nitride added may be also employed.

Silicon oxide, silicon nitride, or silicon oxynitride can be employed in the gate insulating film 6004. Alternatively, a film in which these are laminated, for example a film in which SiN is laminated on $SiO_2$ may be employed as the gate insulating film. The silicon oxide film was formed with the plasma-CVD method in the mixed gas of TEOS (Tetraethyl Orthosilicate) and $O_2$, at a reaction pressure of 40 Pa, with a substrate temperature ranging from 300° C. to 400° C., by discharging at a high frequency (13.56 MHz) with an electric density ranging from 0.5 $W/cm^2$ to 0.8 $W/cm^2$. Thus manufactured silicon oxide film obtains a good characteristic as the gate insulating film by performing the thermal annealing at a temperature ranging from 400° C. to 500° C., thereafter. Aluminum nitride can be used as the gate insulating film. The aluminum nitride is comparatively high in heat conductivity, and thereby the heat generated in TFT can be diffused effectively. Moreover, a film in which the aluminum nitride is laminated on the silicon oxide, silicon oxynitride, or the like not including aluminum may be used as the gate insulating film. Furthermore, $SiO_2$ formed with RF sputtering method using Si as a target may be employed as the gate insulating film.

The gate electrode 6005 is formed of the element selected from the group consisting of Ta, W, Ti, Mo, Al, and Cu, or is formed of a chemical compound material or of an alloy material including the above element as its main component. Alternatively a semiconductor film, typically a poly-crystalline silicon film doped with the impurities such as phosphorous, may be employed. In addition, the gate electrode 6005 may be formed of not only the conductive film of a single layer, but also the conductive films with a plurality of layers laminated.

In addition, it is preferable that these conductive films have a structure in which the first conductive film is formed of a tantalum nitride (TaN) and the second conductive film is formed of W, a structure in which the first conductive film is formed of a tantalum nitride (TaN) and the second conductive film is formed of Ti, a structure in which the first conductive film is formed of tantalum nitride (TaN and the second conductive film is formed of Al, or a structure in which the first conductive film is formed of tantalum nitride (TaN) and the second conductive film is formed of Cu. Moreover, the semiconductor film, typically the poly-crystalline silicon film doped with the impurities such as phosphorous, or AgPdCu alloy may be employed as the first and the second conductive films.

The conductive film may be formed not only in two-layers structure, but also in three-layers structure in which for example a tungsten film, an alloy film of aluminum and silicon (Al—Si), and a titanium nitride film are laminated in order. When the conductive film is formed in three-layers structure, tungsten nitride may be employed instead of the tungsten, an alloy film of aluminum and titanium (Al—Ti) may be employed instead of the alloy film of aluminum and silicon (Al—Si), and a titanium film may be employed instead of the titanium nitride film. It is important to select the optimum etching method and the optimum kind of etchant appropriately according to the material of the conductive film.

The transistor 6002 is covered with the first interlayer insulating film 6006 on which the second interlayer insulating film 6007 and the third interlayer insulating film 6008 are laminated. The first interlayer insulating film 6006 can be formed of a silicon oxide film, a silicon nitride film, or a silicon oxynitride film in single layer or in laminated layer with the plasma-CVD method or the sputtering method. The first interlayer insulating film 6006 may be also formed of a film in which the silicon oxynitride film including more oxygen than nitrogen in mole fraction is formed on the silicon oxynitride film including more nitrogen than oxygen in mole fraction. When the heating process (heating process at a temperature ranging from 300° C. to 550° C., for 1 hour to 12 hours) is performed after forming the first interlayer insulating film 6006, it is possible to terminate (hydrogenate) the dangling bond of the semiconductor included in the active layer 6003 by using hydrogen included in the first interlayer insulating film 6006.

The second interlayer insulating film 6007 may be formed of an organic resin film, an inorganic insulating film, an insulating film that comprises Si—$CH_x$-bond and Si—O bond made from the material selected from the siloxane group or the like. In this embodiment, non-photosensitive acrylic is used. The third interlayer insulating film 6008 is formed of a film which is harder to transmit the material causing to promote deterioration of the light-emitting element such as moisture, oxygen, and the like compared with the other insulating film. It is preferable to use typically a DLC film, a carbon nitride film, or a silicon nitride film formed by the RF sputtering method or the like.

In FIG. 17, a reference numeral 6010 denotes an anode, a reference numeral 6011 denotes an electroluminescent layer, a reference numeral 6012 denotes a cathode, and the part in which the anode 6010, the electroluminescent layer 6011 and the cathode 6012 are overlapped corresponds to a light-emitting element 6013. One of the transistors 6002 is a driver transistor for controlling the current supplied to the light-emitting element 6013 and thereby it is connected directly or serially through the other circuit element to the light-emitting element 6013.

The electroluminescent layer 6011 has a single-layer structure of the light-emitting layer or a laminated-layer structure of plural layers including the light-emitting layer.

The anode 6010 is formed on the third interlayer insulating film 6008. An organic resin film 6014 is formed as the barrier diffusion on the third interlayer insulating film 6008. The organic resin film 6014 has an opening 6015 and the light-emitting element 6013 is formed by overlapping the anode 6010, the electroluminescent layer 6011 and the cathode 6012 in the opening 6015.

And a passivation film 6016 is formed on the organic resin film 6014 and the cathode 6012. AS well as the third interlayer insulating film 6008, the passivation film 6016 is formed of the film that is harder to transmit the material causing to promote deterioration of the light-emitting element such as moisture and oxygen, for example a DLC film, a carbon nitride film, a silicon nitride film formed by the RF sputtering method, or the like. It is also possible to form the passivation film by laminating the film described above that is hard to transmit moisture, oxygen, and the like and the film that is easier to transmit moisture, oxygen, and the like compared with the above film.

In addition, the organic resin film 6014 is heated in the vacuum atmosphere in order to remove the moisture, oxygen, and the like stuck thereto before the electroluminescent layer 6011 is formed. Specifically, the heating process is performed in the vacuum atmosphere at a temperature ranging from 100° C. to 200° C. for approximately 0.5 hours to 1 hour. It is desirable that the pressure is set to $3 \times 10^{-7}$ Torr or less, and it is the most desirable that the pressure is $3 \times 10^{-8}$ Torr or less if possible. When the electroluminescent layer is formed after the heating process is performed to the organic resin film in the vacuum atmosphere, it is possible to enhance reliability by keeping it in the vacuum atmosphere until just before forming the electroluminescent layer.

In addition, it is desirable that the end of the opening 6015 in the organic resin film 6014 is made into a round shape so that the end portion of the electroluminescent element layer 6011 formed so as to partially overlap on the organic resin film 6014 does not have a hole. To be more specific, it is desirable that the radius of curvature of the curve line drawn by the sectional surface of the organic resin film in the opening is approximately in the range of 0.2 µm to 2 µm.

With the above structure, the coverage of the electroluminescent layer 6011 and the cathode 6012 that are formed after forming the organic resin film can be enhanced, and thereby it is possible to prevent the anode 6010 and the cathode 6012 from shorting out in the hole formed in the electroluminescent layer 6011. Moreover, by relaxing the stress of the electroluminescent layer 6011, the defect in which the light-emitting region decreases, what is called shrink, can be reduced to enhance the reliability.

In addition, FIG. 17 shows an example in which a positive photosensitive acrylic resin is used as the organic resin film 6014. The photosensitive organic resin is classified into the positive type in which the region exposed with the energy line such as beam, electron, ion, or the like is removed, and the negative type in which the exposed region is not removed. In the present invention, the organic resin film of the negative type may be also used. Moreover, the organic resin film 6014 may be formed of the photosensitive polyimide. When the organic resin film 6014 is formed of the acrylic of the negative type, the end section in the opening 6015 shapes like a letter of S. On this occasion, it is desirable that the radius of the curvature in the upper end and the lower end of the opening is in the range of 0.2 µm to 2 µm.

The anode 6010 can be formed of the transparent conductive film. Not only ITO, but also the transparent conductive film in which indium oxide is mixed with tin oxide (ZnO) by 2% to 20% may be used. In FIG. 17, ITO is used as the anode 6010. The anode 6010 may be polished by CMP method or by cleaning (bellcleaning) with porous body of polyvinyl alcohols so that the surface of the anode 6010 is made flat. Furthermore, the surface of the anode 6010 may be irradiated with the ultraviolet ray or may be processed with oxygen plasma after polishing it with the CMP method.

The cathode 6012 can be formed of the other known material when it is the conductive film whose work function is low. For example, Ca, Al, CaF, MgAg, AlLi, or the like is desirable.

It is noted that FIG. 17 shows the structure in which the light emitted from the light-emitting element is irradiated to the side of the substrate 6000. However, the structure in which the light is irradiated to the side opposite to the substrate may be also employed.

In addition, in FIG. 17, the transistor 6002 is connected to the anode 6010 of the light-emitting element but the present invention is not limited to this structure, and the transistor 6002 may be connected to the cathode 6012 of the light-emitting element. In this case, the cathode is formed on the third interlayer insulating film 6008 with TiN or the like.

In fact, after the state shown in FIG. 17 is obtained, it is preferable to pack (enclose) with the passivation film (laminated film, ultraviolet cured resin film, or the like) or transparent cover member, which is highly airtight and hardly degassing. The reliability of OLED is enhanced when the inside of the cover member is filled with the inert atmosphere or the material having moisture-absorption characteristics (barium oxide, for example) is set in the cover member.

It is noted that the light-emitting device of the present invention is not limited to the manufacturing process described above. Moreover, the semiconductor device in the present invention is not limited to the light-emitting device.

Embodiment 2

This embodiment explains a shape of a beam spot obtained by combining a plurality of CW laser light.

FIG. 20(A) shows an example of the shape of the beam spot oscillated from each of the plurality of laser oscillators on a processing object. The beam spot shown in FIG. 20(A) is elliptical in shape. It is noted that the shape of the beam spot of the laser light oscillated from the laser oscillator is not limited to elliptical in the present invention. The shape of the beam spot depends on the kind of the laser, and the shape thereof can be changed through an optical system. For example, the laser light emitted from the excimer laser L3308 manufactured by Lambda Physik, Inc. (wavelength 308 nm, pulse width 30 ns) is rectangular in shape having a size of 10 mm×30 mm (both are width at half maximum in a beam profile). On the other hand, the laser light emitted from a YAG laser having a cylindrical rod is circular in shape. The laser light emitted from a YAG laser having a slab rod is rectangular in shape. These laser light can be also changed into the laser light having a desired size by further shaping them through the optical system.

FIG. 20(B) shows energy density distribution of the laser light in Y direction of a major axis of the beam spot shown in FIG. 20(A). The beam spot shown in FIG. 20(A) corresponds to the region satisfying the energy density that is 1/e2 of the peak value of the energy density in FIG. 20(B). The energy density distribution of the laser light whose beam spot is elliptical becomes higher toward the center O of the elliptical.

Next, FIG. 20(C) shows the shape of the beam spots when the laser light having the beam spot shown in FIG. 20(A) is combined. It is noted that FIG. 20(C) shows the case in which four beam spots of the laser light are overlapped to form one linear beam spot but the number of the overlapped beam spots is not limited to this.

As shown in FIG. 20(C), the beam spot of the laser light are combined to form one beam spot in such a way that the major axis of each elliptical beam is corresponded and the beam spots are overlapped partially one another. It is noted that the straight line obtained by connecting the center O of each elliptical beam spot is defined as the center axis of the beam spot.

FIG. 20(D) shows the energy density distribution of the laser light in y direction of the center axis of the beam spots after being combined shown in FIG. 20(C). It is noted that the beam spot shown in FIG. 20(C) corresponds to the region satisfying the energy density that is $1/e^2$ of the peak value of the energy density in FIG. 20(B). The energy density is added in the portion in which each beam spot before being combined is overlapped. For example, when the energy density E1 and the energy density E2 of the overlapped beam spots as shown diagrammatically are added, the added value is almost equal to the peak value E3 of the energy density of the beam spot. Thus the energy density is made flat between the centers O of the respective elliptical beam spots.

It is ideal for the value added with E1 and E2 to be equal to E3. In fact, however, they are not always equal. It is possible for a designer to determine the margin of the gap between the value added with E1 and E2, and the value E3 appropriately.

As shown in FIG. 20(A), when the beam spot is employed singularly, it is difficult to irradiate the semiconductor film or the whole part to become the island, which contacts the flat portion of the insulating film, with the laser light having homogeneous energy density since the beam spot has Gaussian energy distribution. FIG. 20(D) indicates, however, that it is possible to enhance the crystallinity of the semiconductor film effectively because the region having homogeneous energy density is more enlarged by employing a plurality of laser light overlapped so as to compensate the part having low energy density each other than employing the laser light singularly not being overlapped with a plurality of laser light.

It is possible to perform the structure of this embodiment in combination with the embodiment 1.

BRIEF DESCRIPTION OF DRAWINGS

[FIG. 18] a graph to show the energy density in every shot of the pulsed laser light, a graph to show the drain current density of TFT for supplying current to the light-emitting TFT, and a photograph of the pixel portion that is enlightened in fact.

Figure 1A:
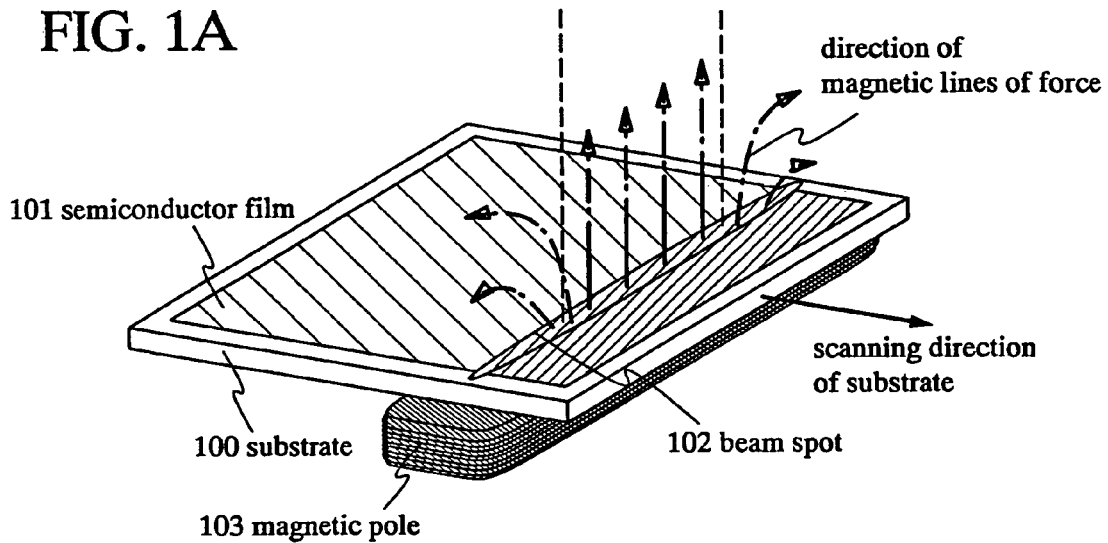
[FIG. 1] drawings to show the relation between the direction of the magnetic lines of force and the scanning direction of the beam spot and the substrate in the pulsed laser irradiation apparatus of the present invention.
Figure 1B:
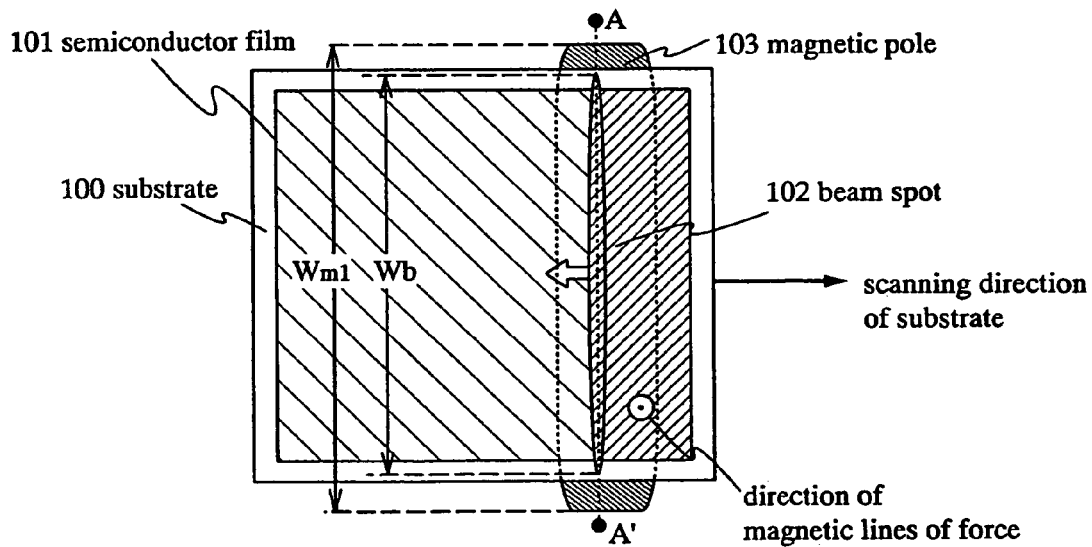
Figure 1C:
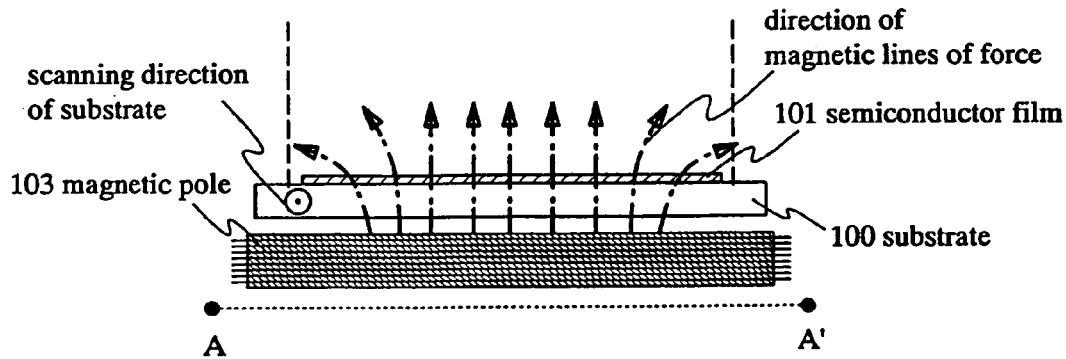
Figure 2A:
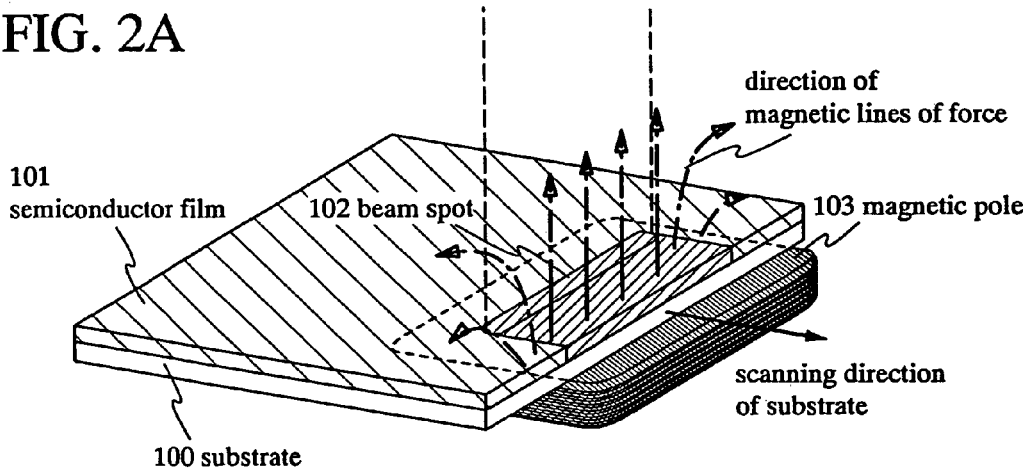
[FIG. 2] drawings to show the relation between the direction of the magnetic lines of force and the scanning direction of the beam spot and the substrate in the CW laser irradiation apparatus of the present invention.
Figure 2B:
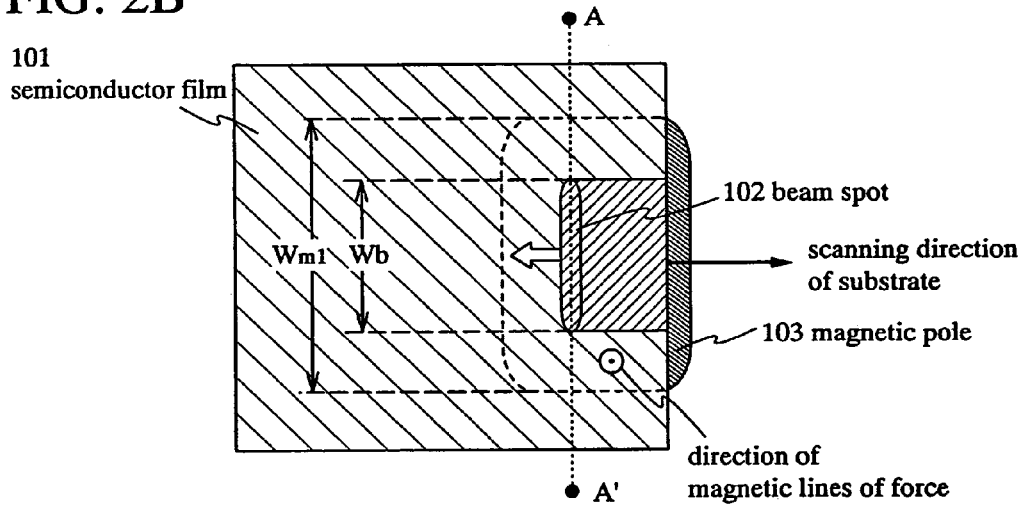
Figure 2C:
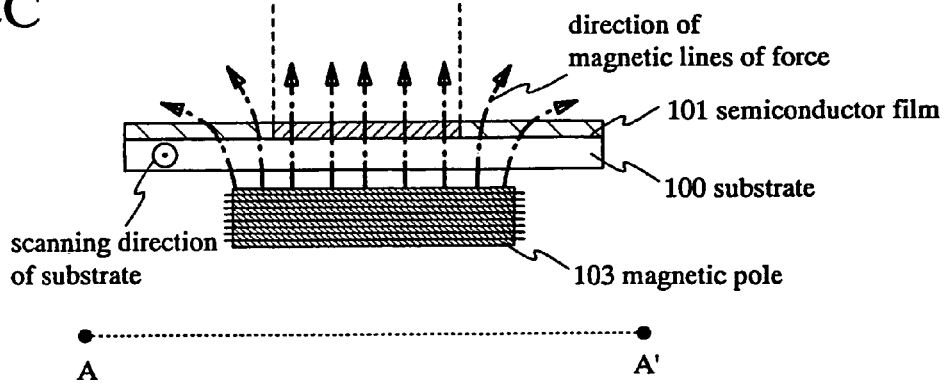
Figure 3A:
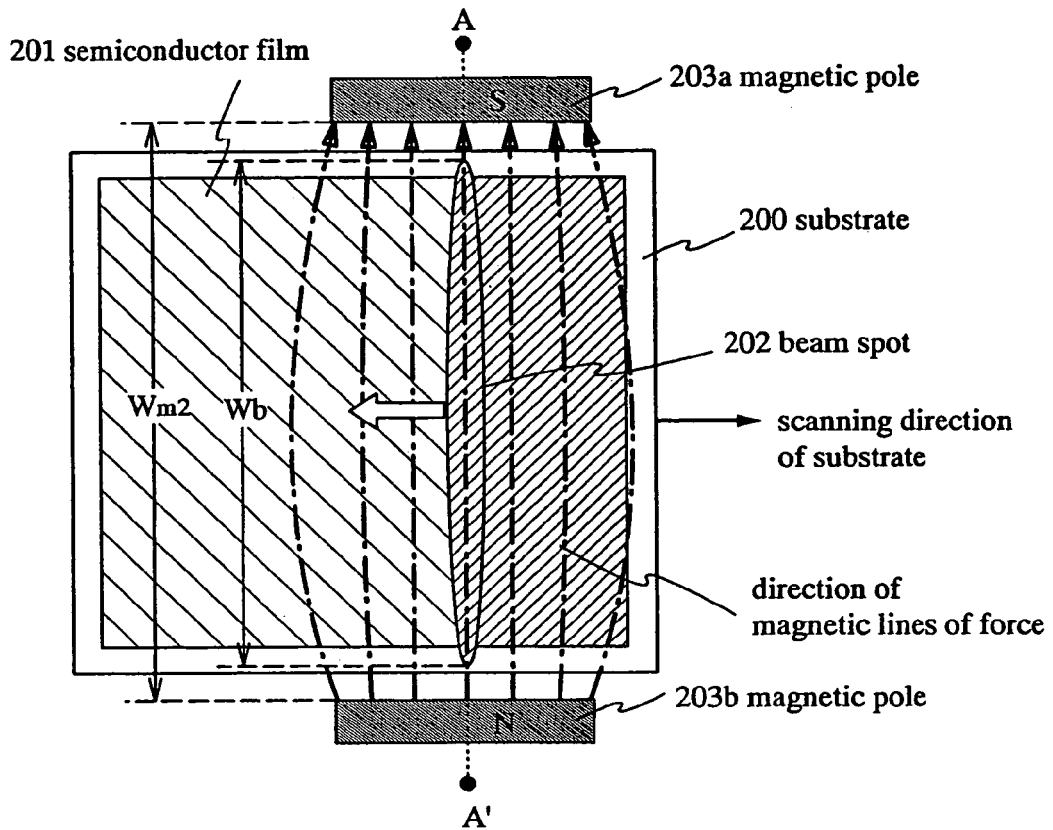
[FIG. 3] drawings to show the relation between the direction of the magnetic lines of force and the scanning direction of the beam spot and the substrate in the pulsed laser irradiation apparatus of the present invention.
Figure 3B:
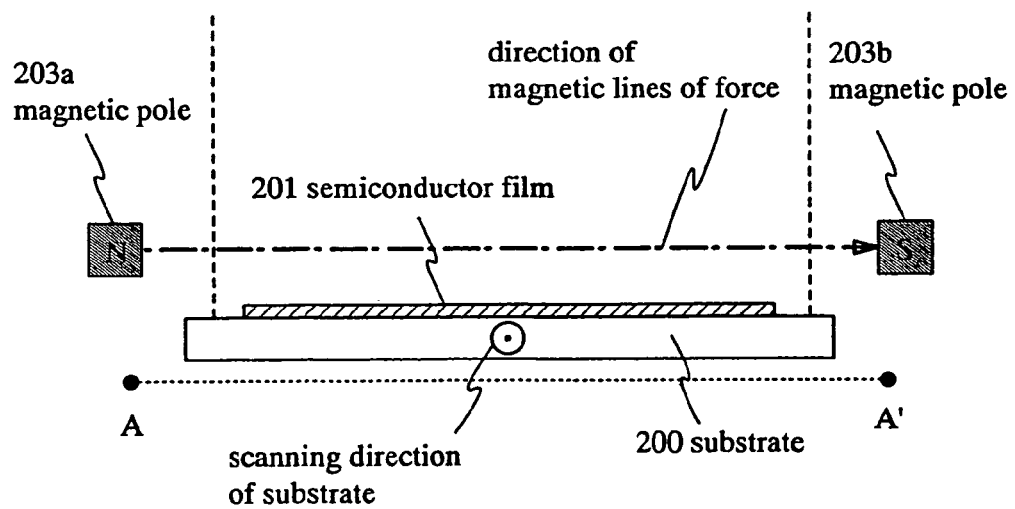
Figure 4A:
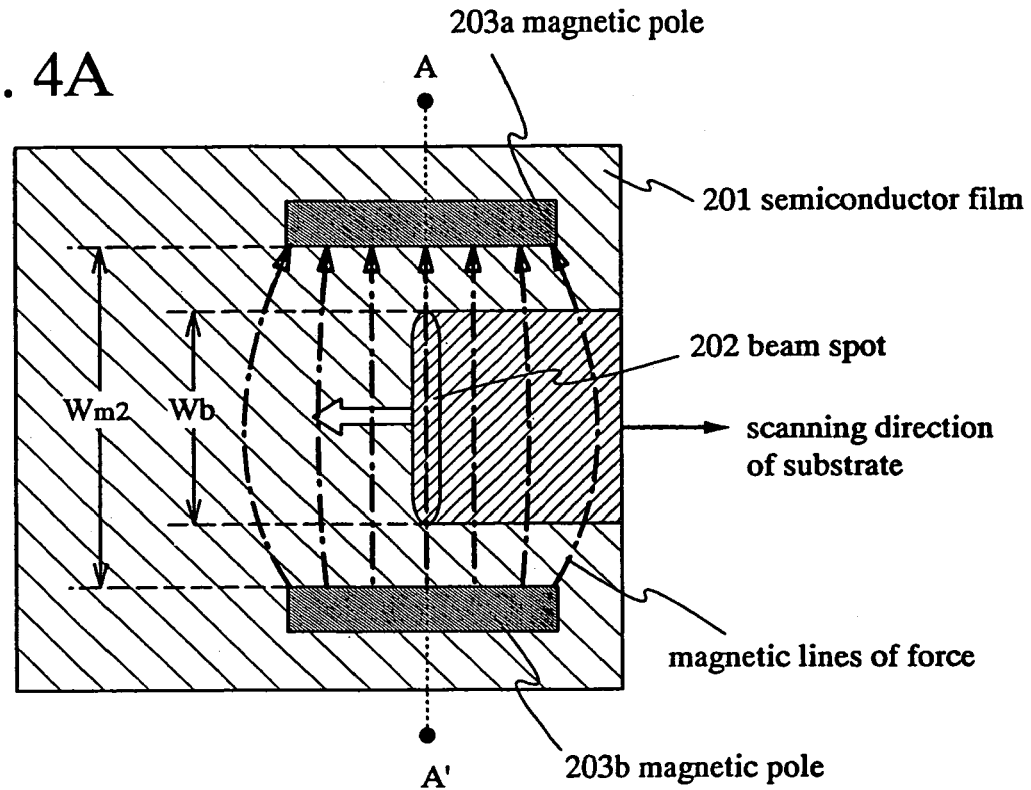
[FIG. 4] drawings to show the relation between the direction of the magnetic lines of force and the scanning direction of the beam spot and the substrate in the CW laser irradiation apparatus of the present invention.
Figure 4B:
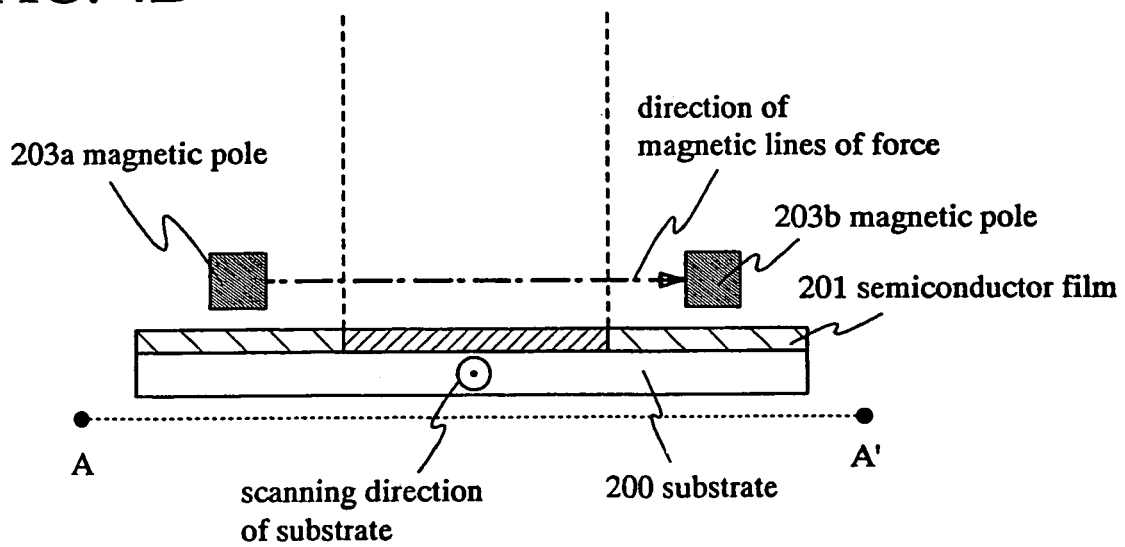
Figure 5A:
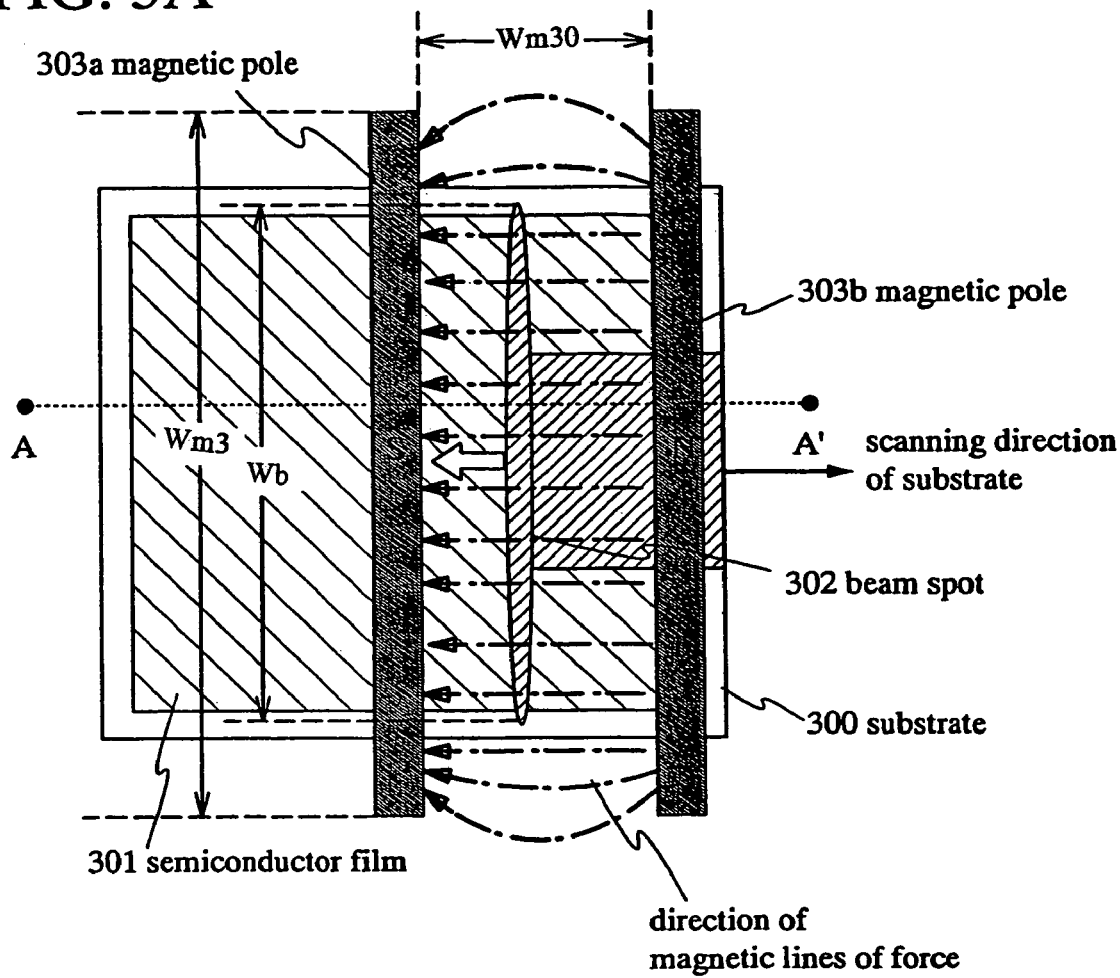
[FIG. 5] drawings to show the relation between the direction of the magnetic lines of force and the scanning direction of the beam spot and the substrate in ihe pulsed laser irradiation apparatus of the present invention.
Figure 5B:
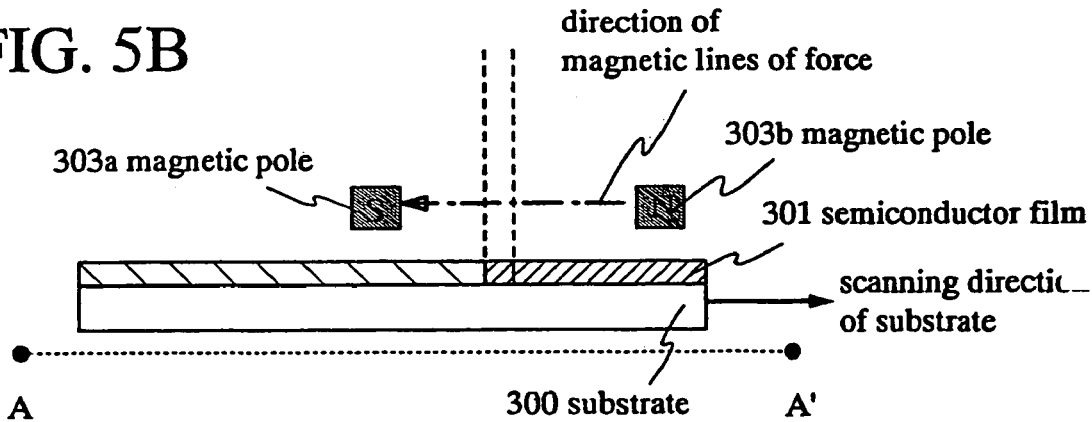
Figure 6A:
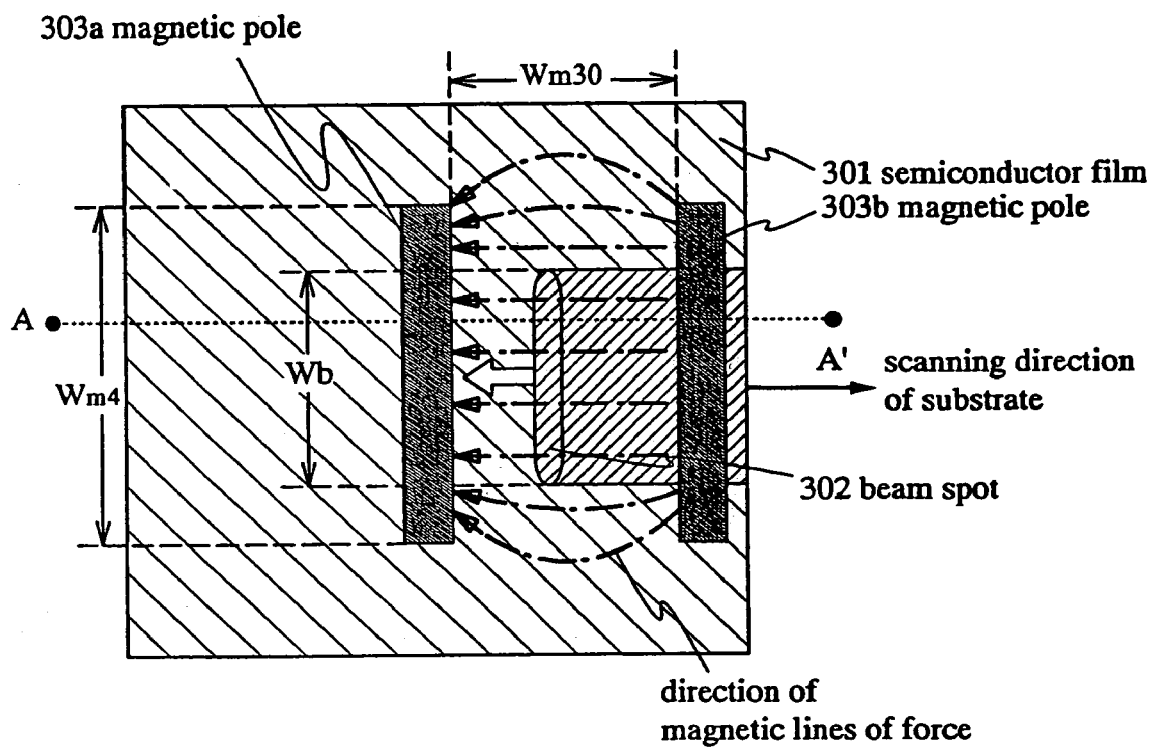
[FIG. 6] drawings to show the relation between the direction of the magnetic lines of force and the scanning direction of the beam spot and the substrate in the CW laser irradiation apparatus of the present invention.
Figure 6B:
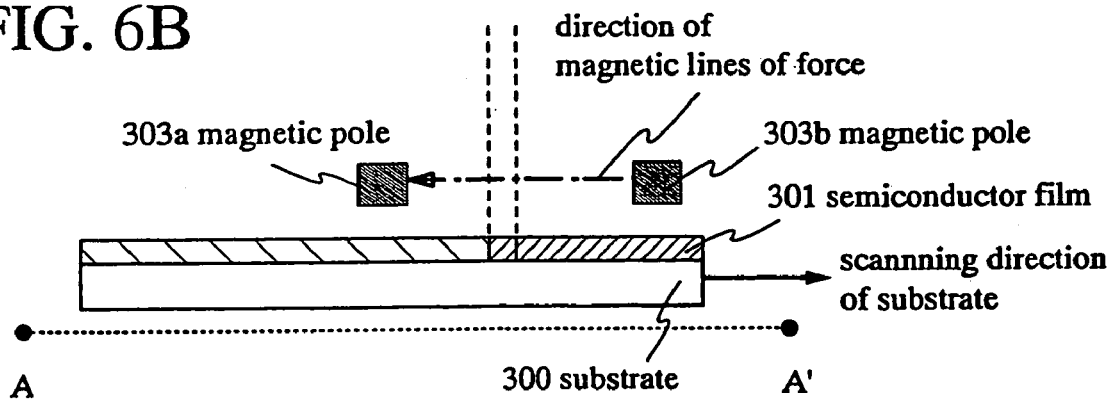
Figure 7A:
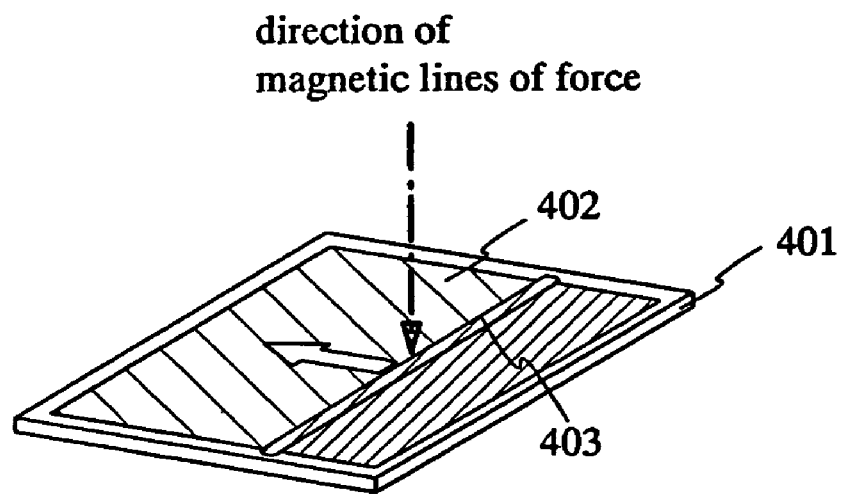
[FIG. 7] drawings to show the relation between the direction of the magnetic lines of force and the scanning direction of the beam spot and the substrate in the pulsed laser irradiation apparatus of the present invention.
Figure 7B:
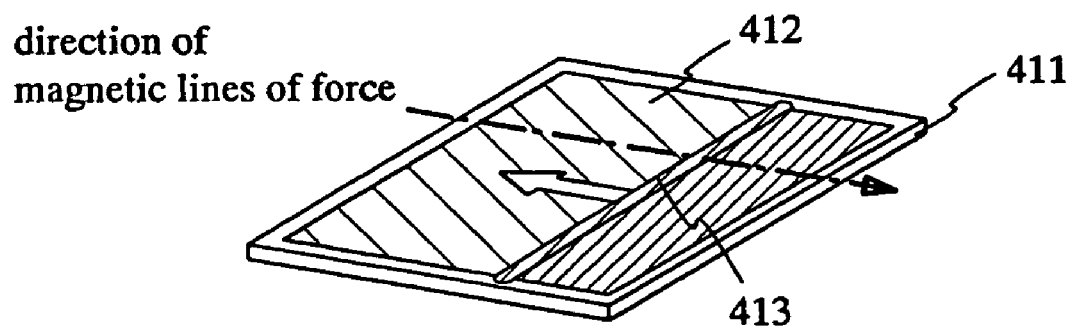
Figure 8A:
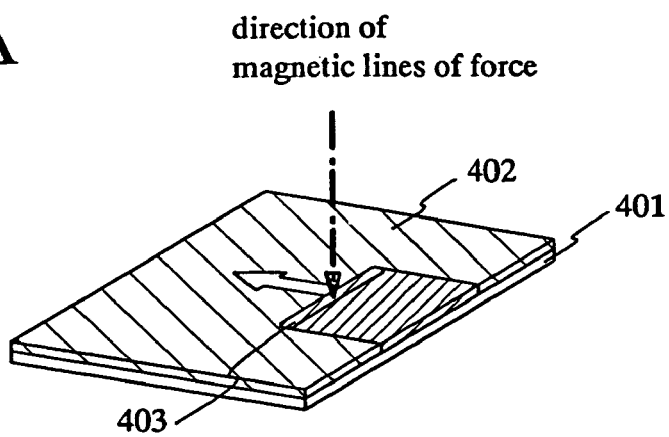
[FIG. 8] drawings to show the relation between the direction of the magnetic lines of force and the scanning direction of the beam spot and the substrate in the CW laser irradiation apparatus of the present invention.
Figure 8B:
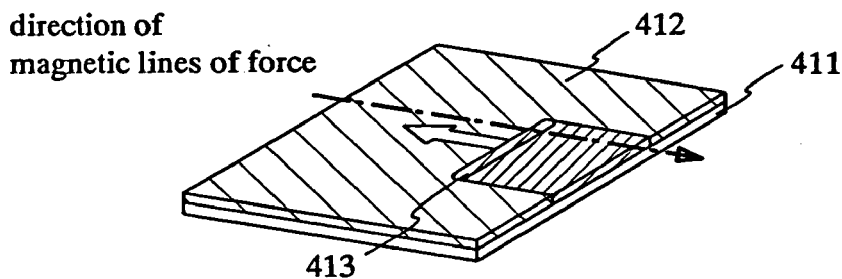
Figure 8C:
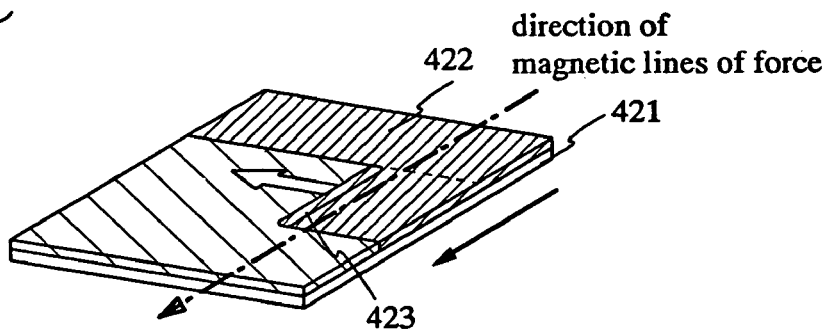
Figure 8D:
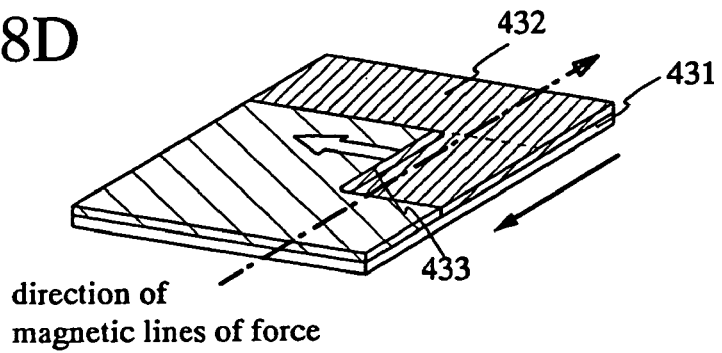
Figure 9A:
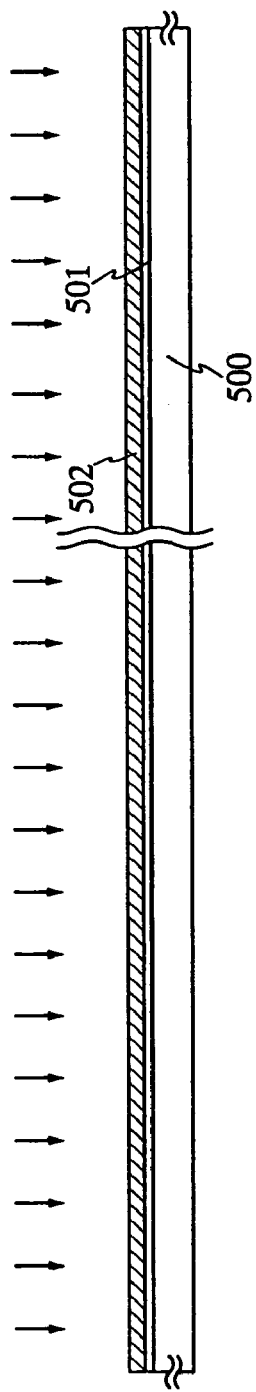
[FIG. 9] drawings to show the method for manufacturing a semiconductor device.
Figure 9B:
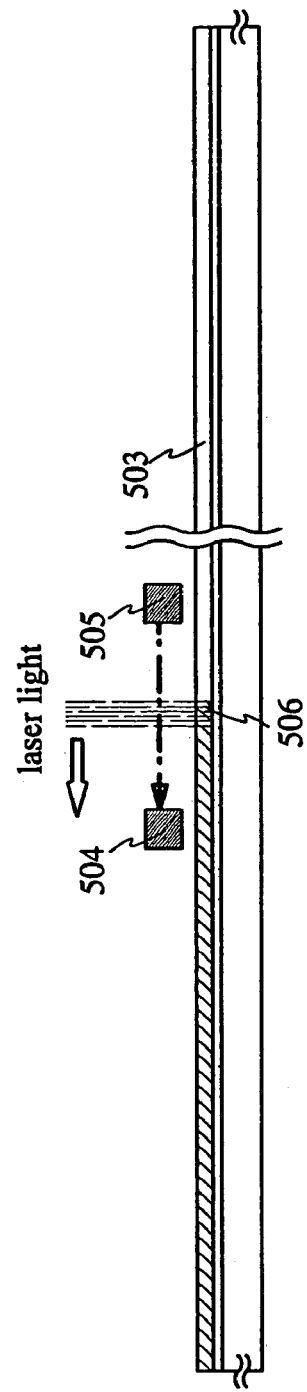
Figure 9C:
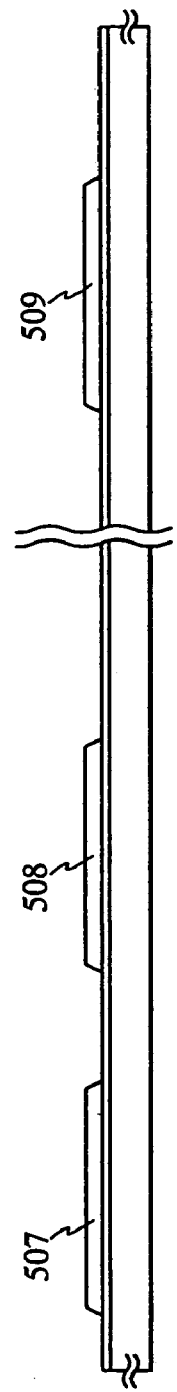
Figure 10A:
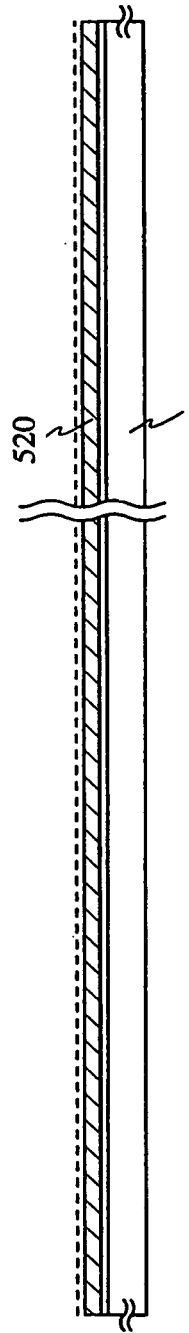
[FIG. 10] drawings to show the method for manufacturing a semiconductor device.
Figure 10B:
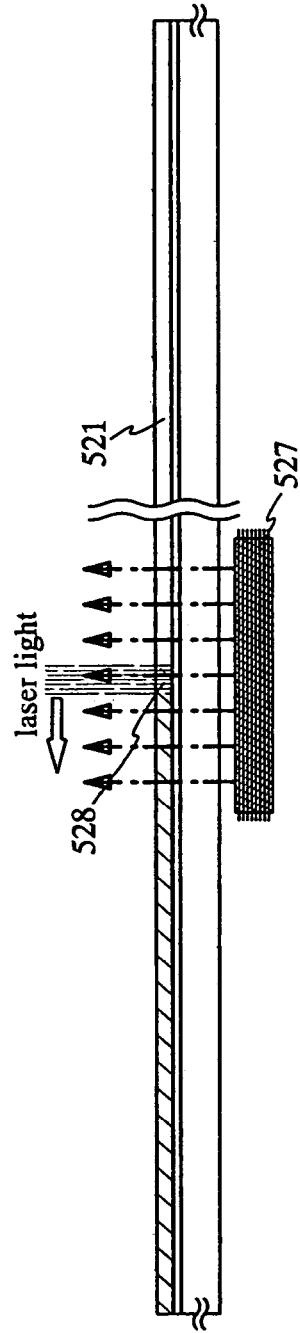
Figure 10C:
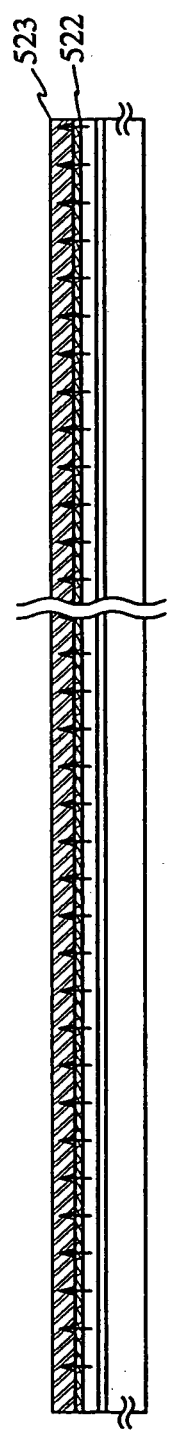
Figure 10D:
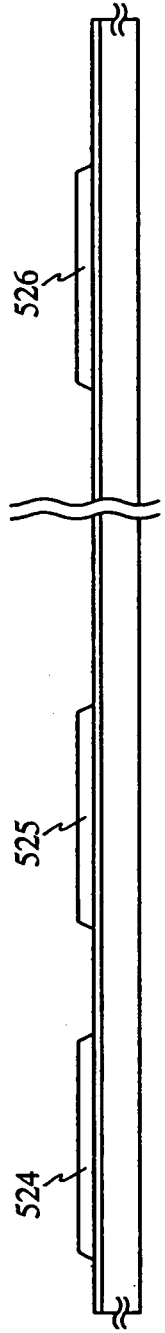
Figure 11A:
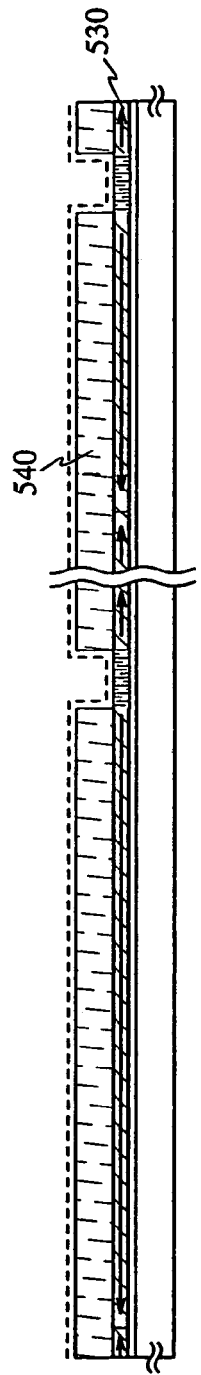
[FIG. 11] drawings to show the method for manufacturing a semiconductor device.
Figure 11B:
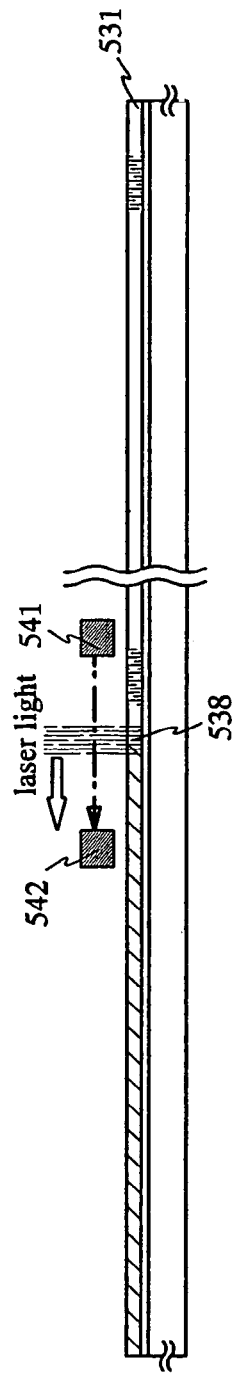
Figure 11C:
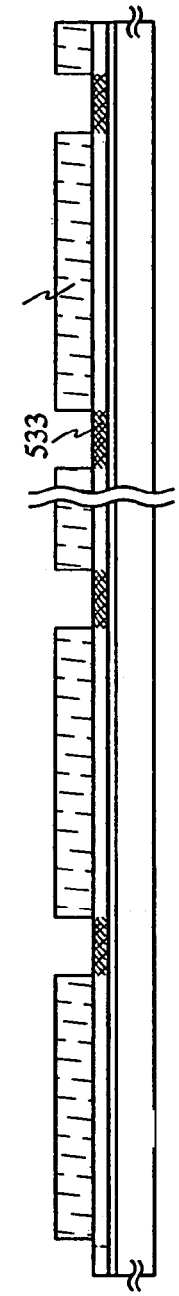
Figure 11D:
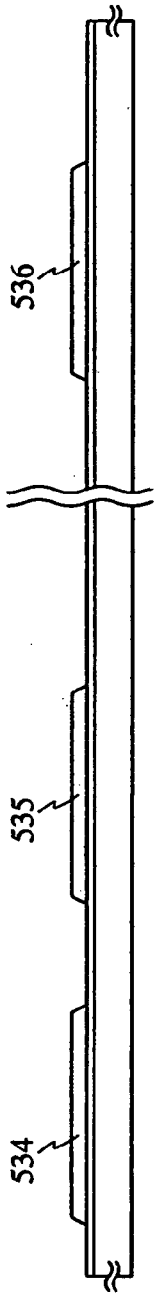
Figure 12:
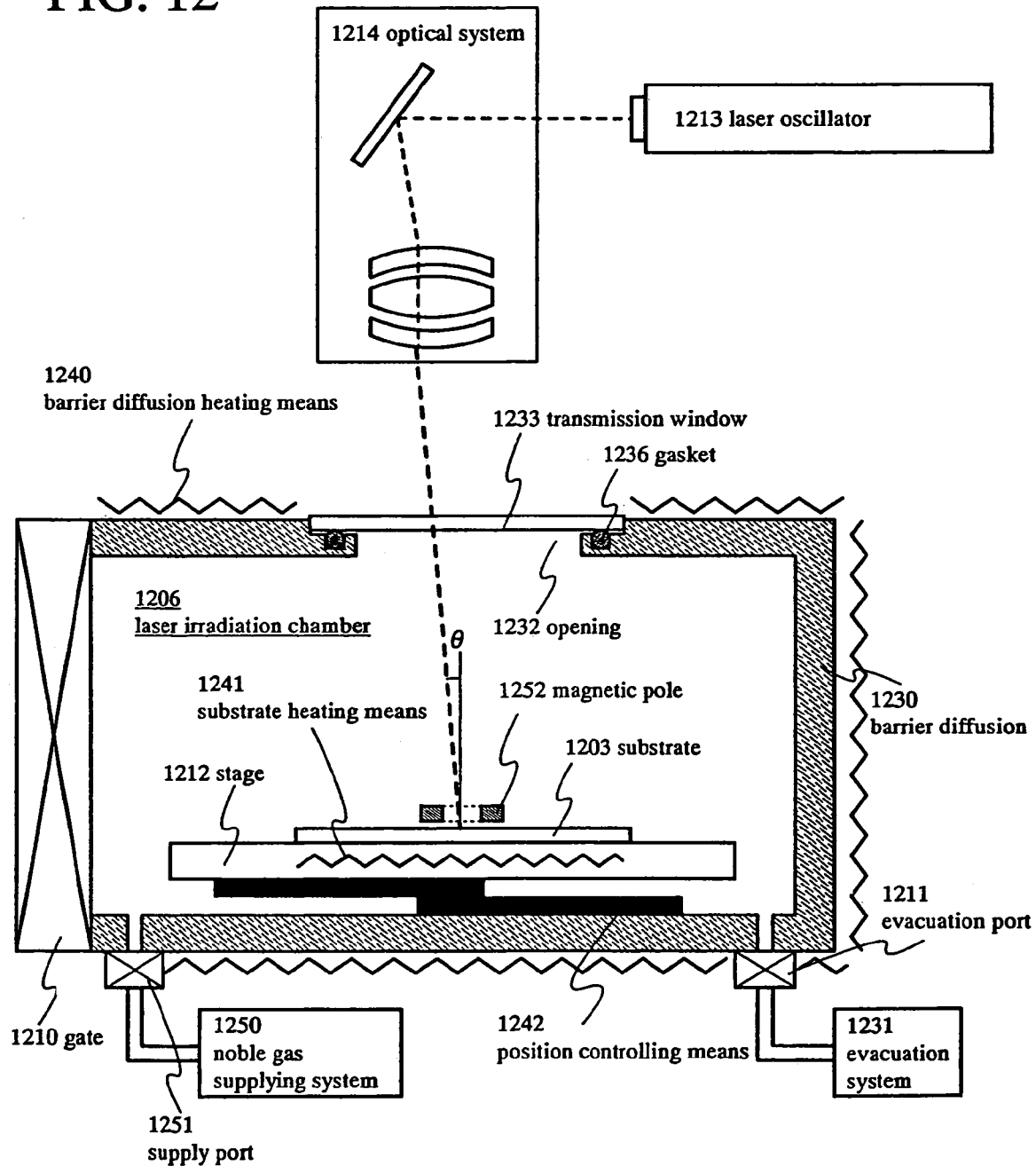
[FIG. 12] a drawing to show the structure of the pulsed laser irradiation apparatus having a load lock system chamber.
Figure 13:
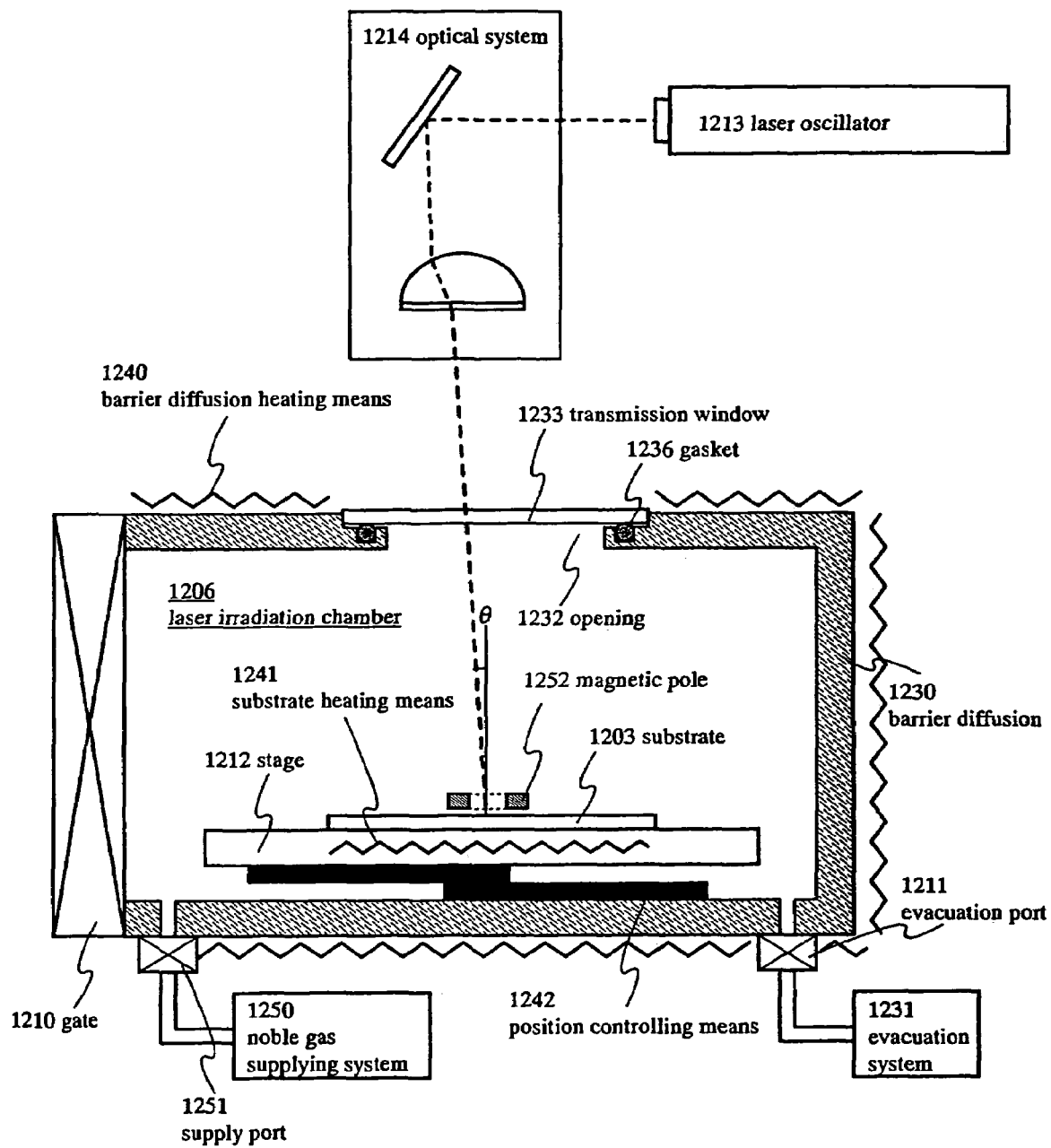
[FIG. 13] a drawing to show the structure of the CW laser irradiation apparatus having a load lock system chamber.
Figure 14:
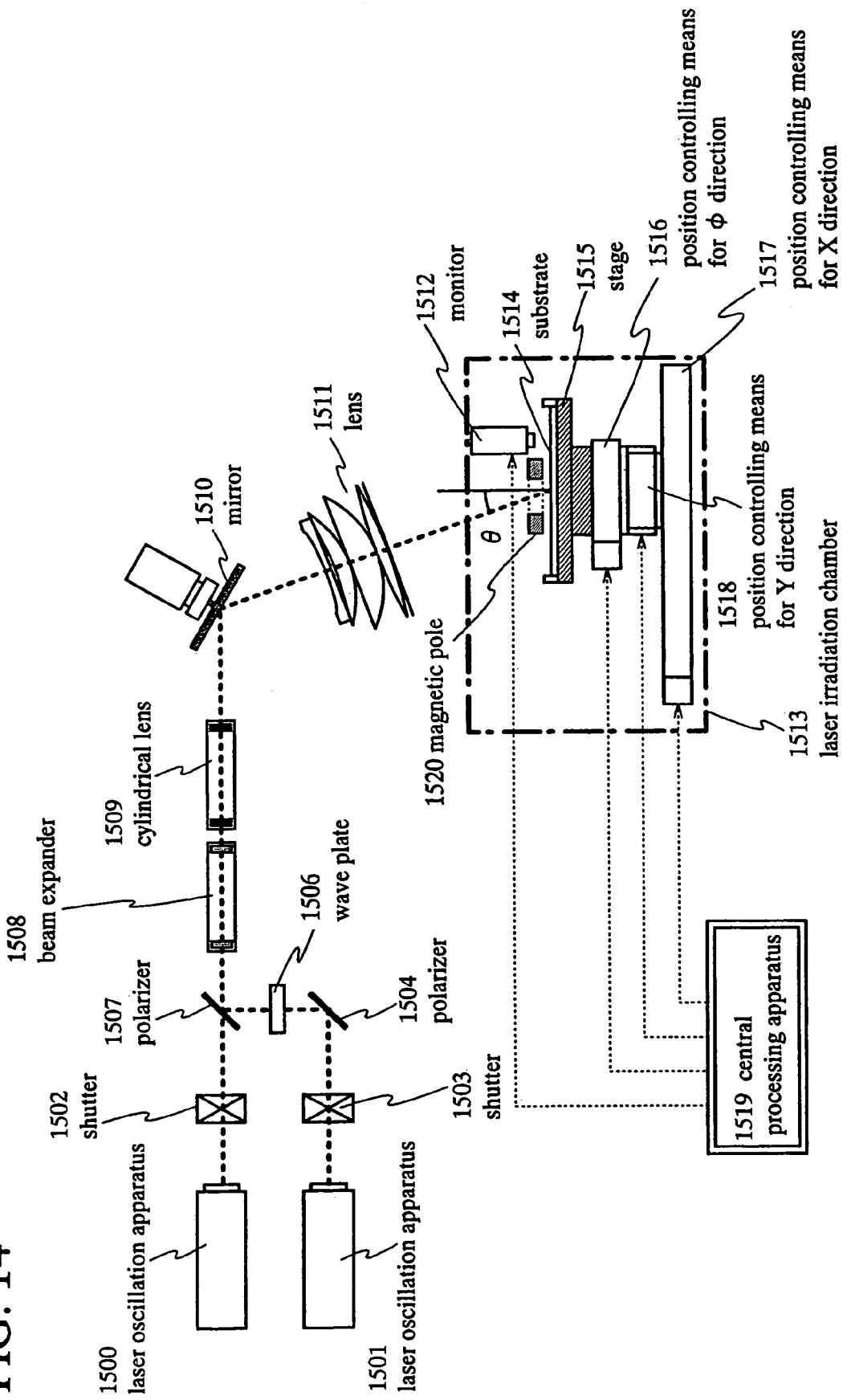
[FIG. 14] a drawing to show the structure of the pulsed laser irradiation apparatus.
Figure 15:
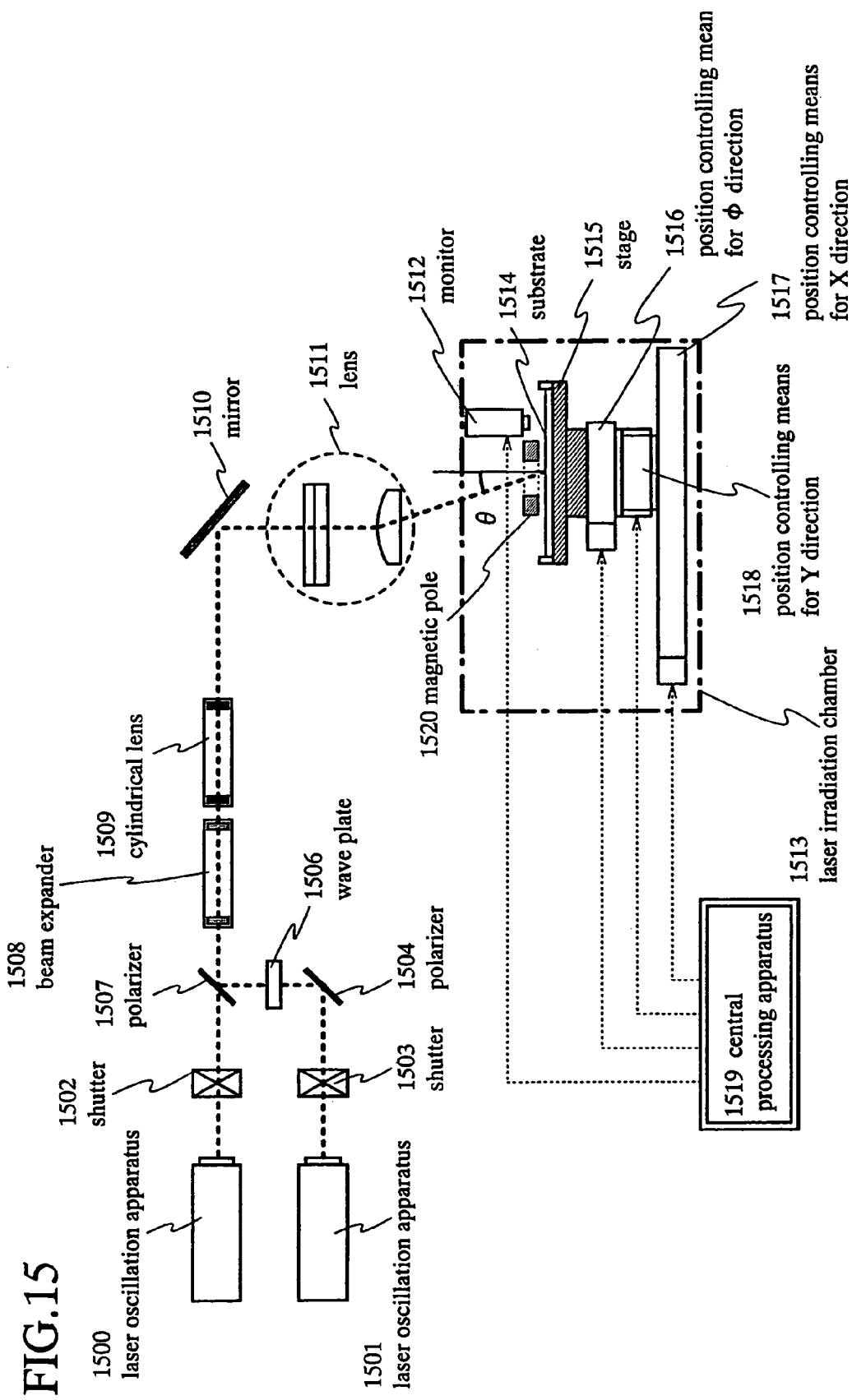
[FIG. 15] a drawing to show the structure of the CW laser irradiation apparatus.
Figure 16A:
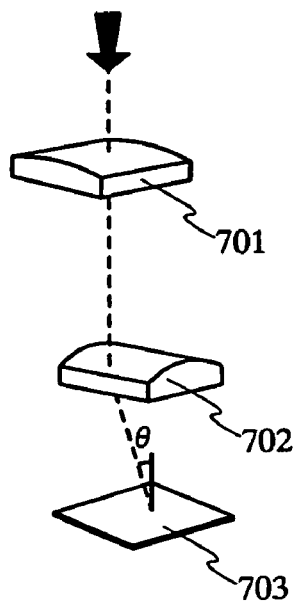
[FIG. 16] drawings to show the optical system in the laser irradiation apparatus.
Figure 16B:
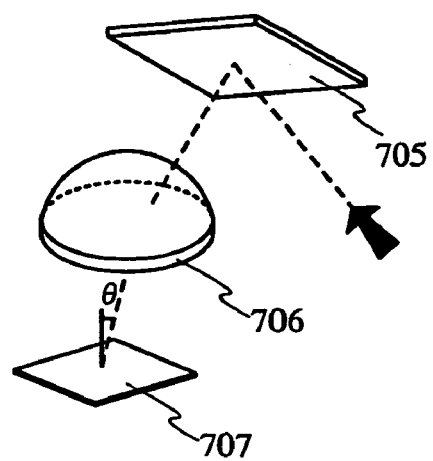
Figure 16C:
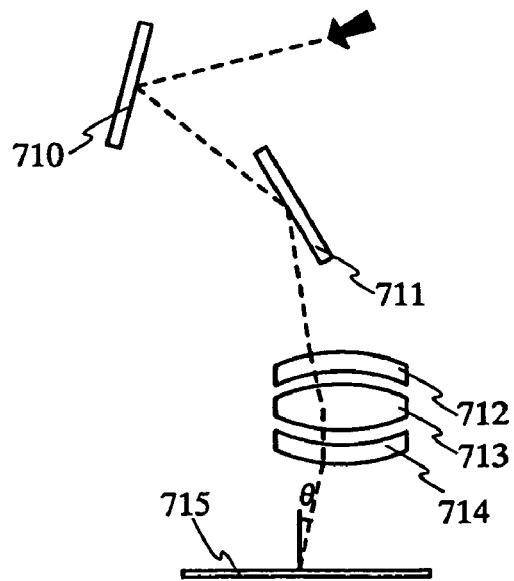
Figure 16D:
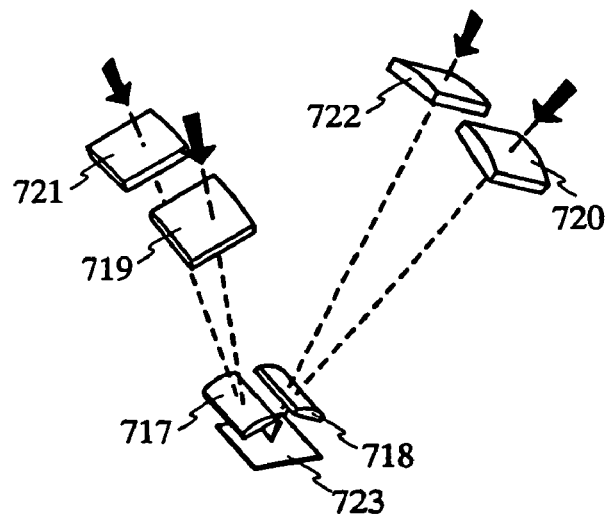
Figure 17:
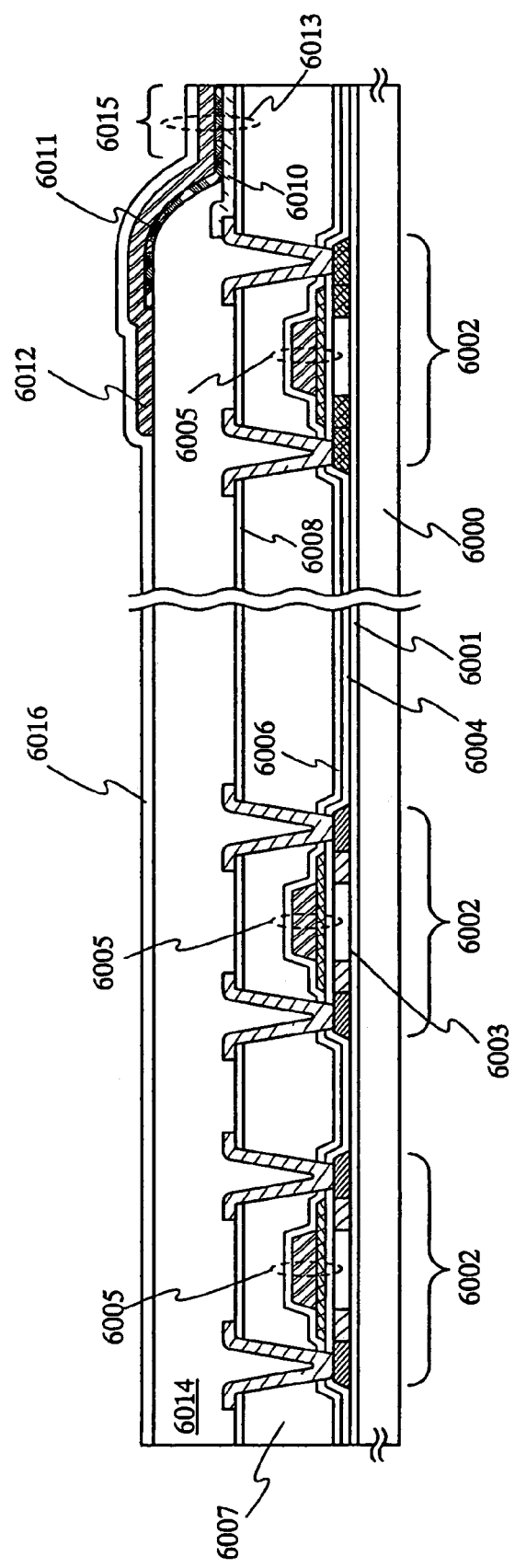
[FIG. 17] a cross-sectional view of the light-emitting device manufactured with the laser irradiation apparatus of the present invention.
Figure 19A:
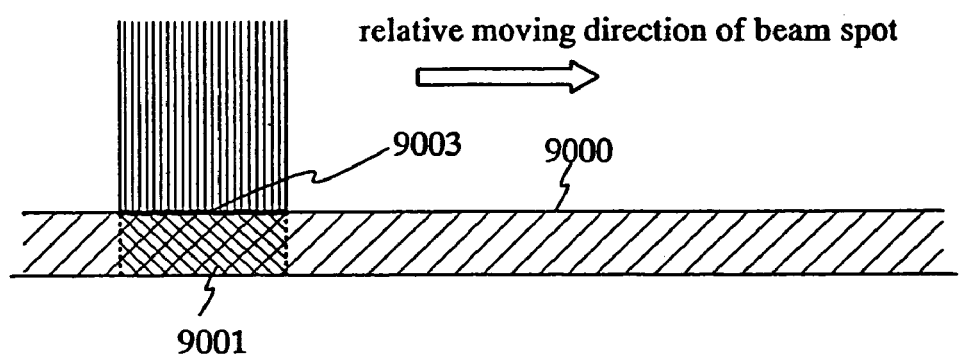
[FIG. 19] drawings to show a mechanism of the impurities intrusion into the semiconductor film.
Figure 19B:
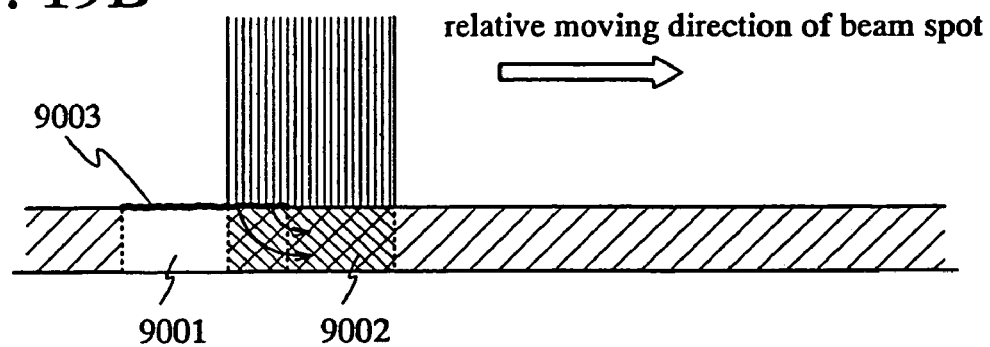
Figure 20A:
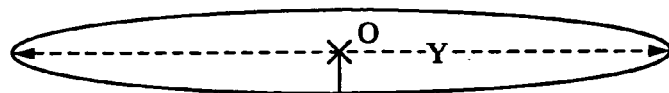
[FIG. 20] drawings to show energy density distribution of the beam spot.
Figure 20B:
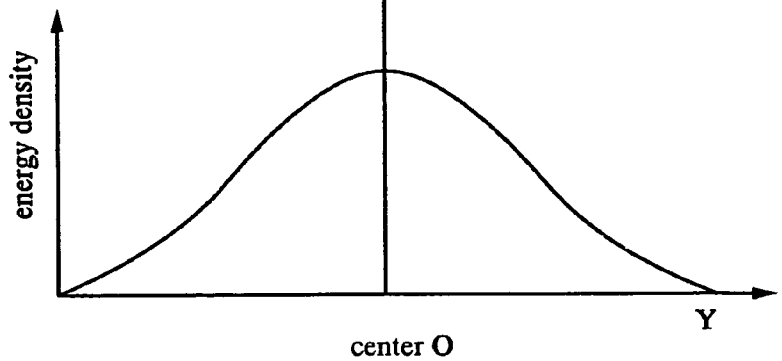
Figure 20C:
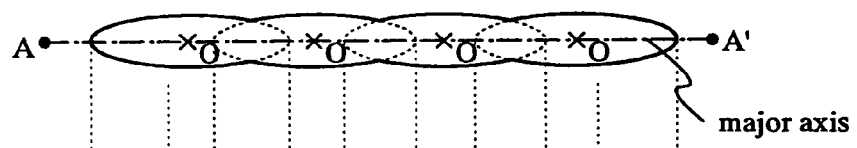
Figure 20D:
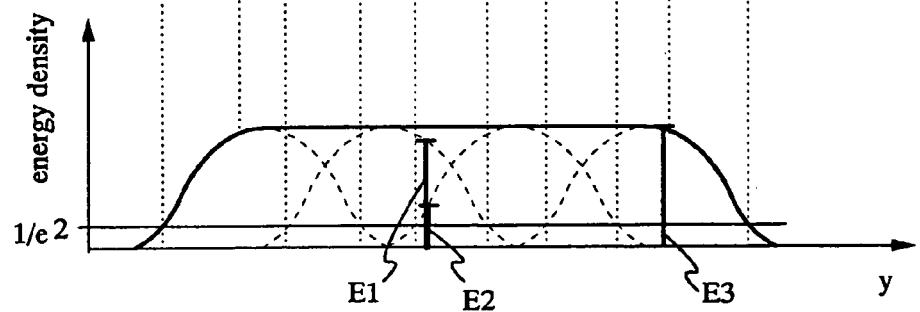

What is claimed is:

1. A method for manufacturing a semiconductor device comprising:
    crystallizing a semiconductor including a first noble gas by irradiating the semiconductor with a laser light in an atmosphere of second noble gas; and
    forming a gate electrode over a crystallized semiconductor with a gate insulating film interposed therebetween,
    wherein a magnetic field is applied to the semiconductor when the semiconductor is irradiated with the laser light.

2. The method for manufacturing a semiconductor device according to claim 1, wherein the laser light is generated in a pulse oscillation.

3. The method for manufacturing a semiconductor device according to claim 1, wherein the laser light is generated in a continuous wave oscillation.

4. The method for manufacturing a semiconductor device according to claim 1, wherein a concentration of the first noble gas in the semiconductor is less than or equal to $1 \times 10^{21}$ atoms/cm$^3$.

5. The method for manufacturing a semiconductor device according to claim 1, wherein a magnetic flux density of the magnetic field is in the range of 1000 G to 10000 G.

6. The method for manufacturing a semiconductor device according to claim 1, wherein the semiconductor device comprises a light-emitting device.

7. The method for manufacturing a semiconductor device according to claim 1, wherein the semiconductor device comprises a thin film transistor.

8. The method for manufacturing a semiconductor device according to claim 1, further comprising a step of crystallizing the semiconductor with a catalyst element before irradiating the laser light.

9. The method for manufacturing a semiconductor device according to claim 1, wherein the semiconductor comprises silicon.

10. The method for manufacturing a semiconductor device according to claim 1, wherein the semiconductor is a semiconductor film formed on an insulating surface.

11. A method for manufacturing a semiconductor device comprising:
    crystallizing a semiconductor including a first noble gas by irradiating the semiconductor with a laser light in an atmosphere of second noble gas; and
    forming a gate electrode over a crystallized semiconductor with a gate insulating film interposed therebetween,
    wherein a magnetic field is applied to the semiconductor in a direction perpendicular to the semiconductor when the semiconductor is irradiated with the laser light.

12. The method for manufacturing a semiconductor device according to claim 11, wherein the laser light is generated in a pulse oscillation.

13. The method for manufacturing a semiconductor device according to claim 11, wherein the laser light is generated in a continuous wave oscillation.

14. The method for manufacturing a semiconductor device according to claim 11, wherein a concentration of the first noble gas in the semiconductor is less than or equal to $1 \times 10^{21}$ atoms/cm$^3$.

15. The method for manufacturing a semiconductor device according to claim 11, wherein a magnetic flux density of the magnetic field is in the range of 1000 G to 10000 G.

16. The method for manufacturing a semiconductor device according to claim 11, wherein the semiconductor device is a light-emitting device.

17. The method for manufacturing a semiconductor device according to claim 11, wherein the semiconductor device comprises a thin film transistor.

18. The method for manufacturing a semiconductor device according to claim 11, further comprising a step of crystallizing the semiconductor with a catalyst element before irradiating the laser light.

19. The method for manufacturing a semiconductor device according to claim 11, wherein the semiconductor comprises silicon.

20. The method for manufacturing a semiconductor device according to claim 11, wherein the semiconductor is a semiconductor film formed on an insulating surface.

21. A method for manufacturing a semiconductor device comprising:
    crystallizing a semiconductor including a first noble gas by irradiating the semiconductor with a laser light in an atmosphere of second noble gas; and
    forming a gate electrode over a crystallized semiconductor with a gate insulating film interposed therebetween,
    wherein a magnetic field is applied to the semiconductor in a direction parallel to a scanning direction of the laser light when the semiconductor is irradiated with the laser light.

22. The method for manufacturing a semiconductor device according to claim 21, wherein the laser light is generated in a pulse oscillation.

23. The method for manufacturing a semiconductor device according to claim 21, wherein the laser light is generated in a continuous wave oscillation.

24. The method for manufacturing a semiconductor device according to claim 21, wherein a concentration of the first noble gas in the semiconductor is less than or equal to $1 \times 10^{21}$ atoms/cm$^3$.

25. The method for manufacturing a semiconductor device according to claim 21, wherein a magnetic flux density of the magnetic field is in the range of 1000 G to 10000 G.

26. The method for manufacturing a semiconductor device according to claim 21, wherein the semiconductor device is a light-emitting device.

27. The method for manufacturing a semiconductor device according to claim 21, wherein the semiconductor device comprises a thin film transistor.

28. The method for manufacturing a semiconductor device according to claim 21, further comprising a step of crystallizing the semiconductor with a catalyst element before irradiating the laser light.

29. The method for manufacturing a semiconductor device according to claim 21, wherein the semiconductor comprises silicon.

30. The method for manufacturing a semiconductor device according to claim 21, wherein the semiconductor is a semiconductor film formed on an insulating surface.

31. A method for manufacturing a semiconductor device comprising:
crystallizing a semiconductor including a first noble gas by irradiating the semiconductor with a laser light in an atmosphere of second noble gas; and
forming a gate electrode over a crystallized semiconductor with a gate insulating film interposed therebetween,
wherein a magnetic field is applied to the semiconductor in a direction parallel to the semiconductor and in a direction perpendicular to a scanning direction of the laser light when the semiconductor is irradiated with the laser light.

32. The method for manufacturing a semiconductor device according to claim 31, wherein the laser light is generated in a pulse oscillation.

33. The method for manufacturing a semiconductor device according to claim 31, wherein the laser light is generated in a continuous wave oscillation.

34. The method for manufacturing a semiconductor device according to claim 31, wherein a concentration of the first noble gas in the semiconductor is less than or equal to $1 \times 10^{21}$ atoms/cm$^3$.

35. The method for manufacturing a semiconductor device according to claim 31, wherein a magnetic flux density of the magnetic field is in the range of 1000 G to 10000 G.

36. The method for manufacturing a semiconductor device according to claim 31, wherein the semiconductor device is a light-emitting device.

37. The method for manufacturing a semiconductor device according to claim 31, wherein the semiconductor device comprises a thin film transistor.

38. The method for manufacturing a semiconductor device according to claim 31, further comprising a step of crystallizing the semiconductor with a catalyst element before irradiating the laser light.

39. The method for manufacturing a semiconductor device according to claim 31, wherein the semiconductor comprises silicon.

40. The method for manufacturing a semiconductor device according to claim 31, wherein the semiconductor is a semiconductor film formed on an insulating surface.

* * * * *